(12) United States Patent
Chun et al.

(10) Patent No.: US 9,947,878 B2
(45) Date of Patent: Apr. 17, 2018

(54) ORGANIC LIGHT-EMITTING DEVICE

(71) Applicant: LG CHEM, LTD., Seoul (KR)

(72) Inventors: Minseung Chun, Daejeon (KR); Sang Young Jeon, Daejeon (KR); Minwoo Choi, Daejeon (KR); Hyok Joon Kwon, Daejeon (KR); Hyoungcheul Kim, Daejeon (KR); Minjun Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/113,264

(22) PCT Filed: Jul. 14, 2015

(86) PCT No.: PCT/KR2015/007308
§ 371 (c)(1),
(2) Date: Jul. 21, 2016

(87) PCT Pub. No.: WO2016/027989
PCT Pub. Date: Feb. 25, 2016

(65) Prior Publication Data
US 2017/0012217 A1   Jan. 12, 2017

(30) Foreign Application Priority Data

Aug. 20, 2014   (KR) .................. 10-2014-0108557

(51) Int. Cl.
*H01L 51/00*   (2006.01)
*C09K 11/06*   (2006.01)
(Continued)

(52) U.S. Cl.
CPC .......... *H01L 51/0072* (2013.01); *C09K 11/02* (2013.01); *C09K 11/025* (2013.01); *C09K 11/06* (2013.01); *H01L 51/006* (2013.01); *H01L 51/0052* (2013.01); *H01L 51/0054* (2013.01); *H01L 51/0059* (2013.01);
(Continued)

(58) Field of Classification Search
CPC ....... C09K 11/02; C09K 11/025; C09K 11/06; C09K 2211/1007; C09K 2211/1029; C09K 2211/1044; C09K 2211/1059; C09K 2211/1092; C09K 2211/185; H01L 2251/552; H01L 51/0052; H01L 51/0054; H01L 51/0059; H01L 51/006; H01L 51/0061; H01L 51/0067; H01L 51/0068;
(Continued)

(56) References Cited

U.S. PATENT DOCUMENTS 8,846,215 B2   9/2014   Chun et al.
2007/0247059 A1   10/2007   Cho et al.
(Continued)

FOREIGN PATENT DOCUMENTS

CN   101010407 A   8/2007
CN   101030624 A   9/2007
(Continued)

OTHER PUBLICATIONS

International Search Report from PCT/KR/2015/007909, dated Nov. 12, 2015 with English translation.
(Continued)

*Primary Examiner* — Dawn Garrett
(74) *Attorney, Agent, or Firm* — Dentons US LLP

(57) ABSTRACT

The present specification relates to an organic light emitting diode.

11 Claims, 1 Drawing Sheet

(51) Int. Cl.
  *C09K 11/02* (2006.01)
  *H01L 51/50* (2006.01)

(52) U.S. Cl.
  CPC ...... *H01L 51/0061* (2013.01); *H01L 51/0067* (2013.01); *H01L 51/0068* (2013.01); *H01L 51/0074* (2013.01); *H01L 51/5004* (2013.01); *C09K 2211/1007* (2013.01); *C09K 2211/1029* (2013.01); *C09K 2211/1044* (2013.01); *C09K 2211/1059* (2013.01); *C09K 2211/1092* (2013.01); *C09K 2211/185* (2013.01); *H01L 51/5016* (2013.01); *H01L 51/5056* (2013.01); *H01L 2251/552* (2013.01)

(58) Field of Classification Search
  CPC ............ H01L 51/0072; H01L 51/0074; H01L 51/5004; H01L 51/5016; H01L 51/5056
  See application file for complete search history.

(56) References Cited

U.S. PATENT DOCUMENTS

| | | |
|---|---|---|
| 2011/0210318 A1 | 9/2011 | Bae et al. |
| 2014/0231783 A1 | 8/2014 | Bae et al. |
| 2014/0323723 A1 | 10/2014 | Ahn et al. |
| 2017/0125699 A1 | 5/2017 | Ahn et al. |

FOREIGN PATENT DOCUMENTS

| | | |
|---|---|---|
| CN | 102197027 A | 9/2011 |
| CN | 103221406 A | 7/2013 |
| CN | 103772268 A | 5/2014 |
| CN | 106164046 A | 11/2016 |
| EP | 2821460 A1 | 1/2015 |
| JP | 2009-76817 A | 4/2009 |
| KR | 10-2011-0110508 A | 10/2011 |
| KR | 10-2012-0015883 A | 2/2012 |
| KR | 10-2013-0055198 A | 5/2013 |
| KR | 10-2013-0078746 A | 7/2013 |
| KR | 10-2014-0076522 A | 6/2014 |
| TW | 201329201 A1 | 7/2013 |
| WO | 2013/094885 A1 | 6/2013 |
| WO | 2013/129836 A1 | 9/2013 |
| WO | 2014/014310 A1 | 1/2014 |
| WO | 2014/030921 A1 | 2/2014 |

OTHER PUBLICATIONS

International Search Report from PCT/KR/2015/007308, dated Nov. 12, 2015 with English translation.
Written Opinion of the ISA received in PCT/KR2015/007909, dated Nov. 12, 2015 with English translation.
Written Opinion of the ISA received in PCT/KR2015/007308, dated Nov. 12, 2015 with English translation.
Office Action of Chinese Patent Office in Appl'n No. 201580008262.5, dated Apr. 25, 2017.

ORGANIC LIGHT-EMITTING DEVICE

TECHNICAL FIELD

This application is a National Stage Entry of International Application No. PCT/KR2015/007308, filed Jul. 14, 2015, and claims the benefit of and priority to Korean Application No. 10-2014-0108557, filed Aug. 20, 2014, both of which are incorporated herein by reference in their entirety for all purposes as if fully set forth herein.

The present specification relates to an organic light emitting diode.

BACKGROUND ART

An organic light emission phenomenon is one of the examples of converting current into visible rays through an internal process of a specific organic molecule. The principle of the organic light emission phenomenon is as follows.

When an organic material layer is disposed between a positive electrode and a negative electrode, if voltage is applied between the two electrodes, electrons and holes are injected from the negative electrode and the positive electrode, respectively, into the organic material layer. The electrons and the holes which are injected into the organic material layer are recombined to form an exciton, and the exciton falls down again to the ground state to emit light. An organic light emitting diode using this principle may be composed of a negative electrode, a positive electrode, and an organic material layer disposed therebetween, for example, an organic material layer including a hole injection layer, a hole transporting layer, a light emitting layer, and an electron transporting layer.

The materials used in the organic light emitting diode are mostly pure organic materials or complex compounds in which organic materials and metals form a complex compound, and may be classified into a hole injection material, a hole transporting material, a light emitting material, an electron transporting material, an electron injection material, and the like according to the use thereof. Here, an organic material having a p-type property, that is, an organic material, which is easily oxidized and electrochemically stable when the material is oxidized, is usually used as the hole injection material or the hole transporting material. Meanwhile, an organic material having an n-type property, that is, an organic material, which is easily reduced and electrochemically stable when the material is reduced, is usually used as the electron injection material or the electron transporting material. As the light emitting layer material, a material having both p-type and n-type properties, that is, a material, which is stable during both the oxidation and reduction states, is preferred, and when an exciton is formed, a material having high light emitting efficiency for converting the exciton into light is preferred.

There is a need for developing an organic light emitting diode having high efficiency in the art.

CITATION LIST

Non-Patent Document

Organic Electroluminescence Display, Shizuo Tokito, Chihaya Adchi, Hideyuki Murata

DETAILED DESCRIPTION OF THE INVENTION

Technical Problem

An object of the present specification is to provide an organic light emitting diode having low driving voltage, long service life, and high light emitting efficiency.

Technical Solution

The present specification provides an organic light emitting diode including: a cathode; an anode; a light emitting layer provided between the cathode and the anode; and a hole transporting layer provided between the anode and the light emitting layer, in which the light emitting layer includes a carbazole derivative represented by the following Formula 1, the hole transporting layer includes a spiro compound represented by the following Formula 2, and the difference between the LUMO energy level of the carbazole derivative represented by Formula 1, which is included in the light emitting layer, and the LUMO energy level of the spiro compound represented by Formula 2, which is included in the hole transporting layer, is 0.5 eV or more.

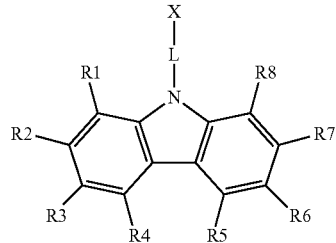

[Formula 1]

In Formula 1,

L is a direct bond; or a substituted or unsubstituted arylene group,

X is a heterocyclic group which is unsubstituted or substituted with one or two or more substituents selected from the group consisting of a heterocyclic group and an aryl group, R3 and R4 combine with each other to form a substituted or unsubstituted aromatic ring, a substituent of the formed aromatic ring; R1; R2; and R5 to R8 are the same as or different from each other, and are each independently hydrogen; deuterium; a substituted or unsubstituted aryl group; or a substituted or unsubstituted heterocyclic group, at least one of a substituent of the formed aromatic ring; R1; R2; and R5 to R8 is -L1-A, L1 is a direct bond; a substituted or unsubstituted arylene group; or a substituted or unsubstituted divalent heterocyclic group, A is a heterocyclic group including one or more of substituted or unsubstituted N and S atoms,

[Formula 2]

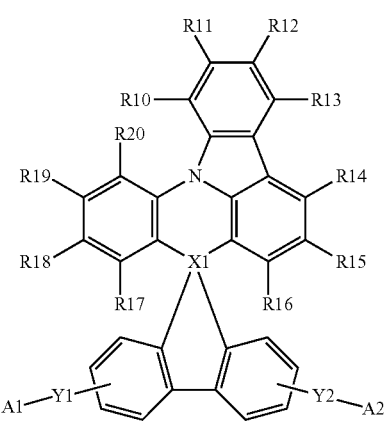

In Formula 2,

X1 is C or Si,

Y1 and Y2 are the same as or different from each other, and are each independently a direct bond; a substituted or unsubstituted arylene group; or a substituted or unsubstituted divalent heterocyclic group, A1 and A2 are the same as or different from each other, and are each independently hydrogen; a substituted or unsubstituted carbazole group; a substituted or unsubstituted benzocarbazole group; or —NZ1Z2, at least one of A1 and A2 is a substituted or unsubstituted carbazole group; a substituted or unsubstituted benzocarbazole group; or —NZ1Z2, Z1 and Z2 are the same as or different from each other, and are each independently hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group, R10 to R20 are the same as or different from each other, and are each independently hydrogen; deuterium; a halogen group; a nitrile group; a nitro group; an imide group; an amide group; an ester group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group, or R10 and R20 may form a ring with a direct bond; or a group selected from the group consisting of O, S, NR, PR, C=O, CRR', and SiRR', and R and R' are the same as or different from each other, and are each independently hydrogen; a nitrile group; a nitro group; an amide group; an ester group; a substituted or unsubstituted alkyl group; a substituted or unsubstituted alkoxy group; a substituted or unsubstituted alkenyl group; a substituted or unsubstituted aryl group; a substituted or unsubstituted arylamine group; or a substituted or unsubstituted heterocyclic group, or R and R' may combine with each other to form a Spiro compound.

Advantageous Effects

The organic light emitting diode according to an exemplary embodiment of the present specification includes a carbazole derivative represented by Formula 1 as a host of a light emitting layer, has a difference between the LUMO energy level of Formula 1 and the LUMO energy level of 0.5 eV or more, and includes the spiro compound represented by Formula 2.

In this case, holes injected from an anode may enter a light emitting layer via a hole transporting layer having appropriate hole mobility and LUMO energy. In this case, the service life of the entire diode may be improved by suppressing exciton-polaron-induced aggregation (EPIA) of excitons and positive polarons which cause a reduction in the service life in a phosphorescent emitting host material. Further, the organic light emitting diode according to an exemplary embodiment of the present specification has an effect that the light emitting efficiency is improved by uniformly distributing the exciton production region in the entire light emitting layer.

It is possible to expect effects of low driving voltage, high light emitting efficiency and/or a long service life from the organic light emitting diode according to an exemplary embodiment of the present specification.

EXPLANATION OF REFERENCE NUMERALS AND SYMBOLS

Figure 1:
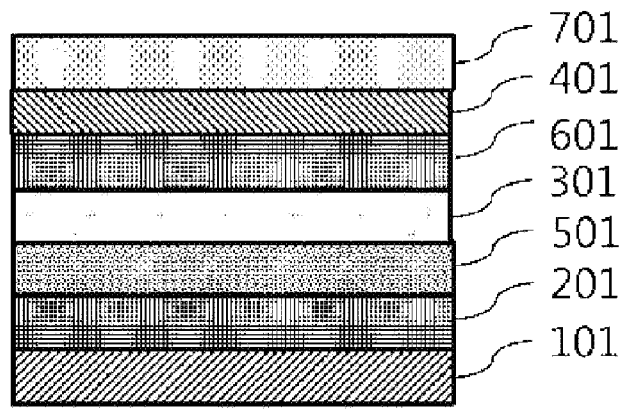
FIG. 1 illustrates an example of an organic light emitting diode according to an exemplary embodiment of the present specification.

101: Anode
201: Hole injection layer
301: Light emitting layer
401: Electron injection layer
501: Hole transporting layer
601: Electron transporting layer
701: Cathode

BEST MODE

Hereinafter, the present specification will be described in detail.

In an exemplary embodiment of the present specification, the carbazole derivative represented by Formula 1 is included as a host of a light emitting layer in an organic light emitting diode.

Excitons produced from the host in the organic light emitting diode may interact with positive polarons to form an aggregation, thereby leading to a reduced service life of the diode. For the aggregation (EPIA: exciton-polaron-induced aggregation) described above, when a diode including only the host without a dopant is driven for a predetermined time, it can be confirmed that a new emission band is generated at the long wavelength by the exciton-polaron-induced aggregation (EPIA).

Figure 2:
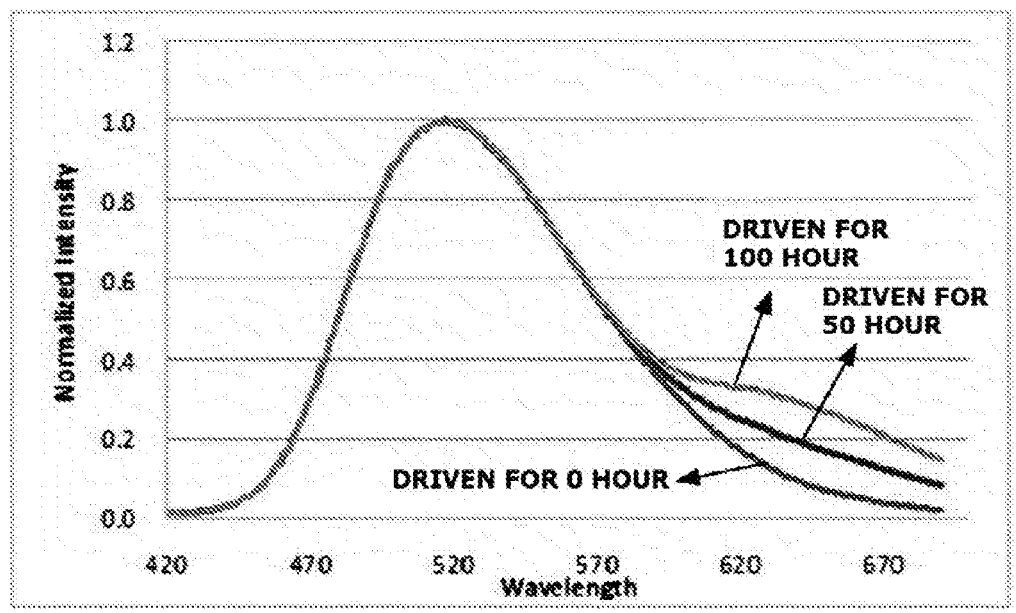
FIG. 2 is a view illustrating the light emitting spectrum of an organic light emitting diode including a carbazole derivative represented by Formula 1-1-1 as a host in a light emitting layer over time.

FIG. 2 is a view illustrating a change in light emitting spectrum after a diode including the carbazole derivative represented by Formula 1-1-1 of the present specification as the host without a dopant is driven for 50 and 100 hours (@ 50 mA/cm$^2$).

In FIG. 2, it can be confirmed that a new red-shifted emission band occurs as a driving time increases, and that the aggregation (EPIA: exciton-polaron-induced aggregation) of excitons and polarons occurs.

In an exemplary embodiment of the present specification, the carbazole derivative represented by Formula 1, which is included in the light emitting layer, has a triplet energy level of 2.5 eV or less.

The hole transporting material according to an exemplary embodiment of the present specification has a triplet energy level for the triplet exciton produced from the dopant so as not to migrate into the hole transporting layer. When the hole transporting material represented by Formula 2, which has the energy level relationship, is included in the hole transporting layer, holes injected from the anode are transported to the light emitting layer via the hole transporting layer having appropriate hole mobility, thereby suppressing aggregation (EPIA; exciton-polaron-induced aggregation) from being formed. Therefore, the organic light emitting diode according to an exemplary embodiment of the present specification may improve high efficiency, low driving voltage, and/or service life characteristics.

Further, in an exemplary embodiment of the present specification, the hole transporting layer includes the spiro compound represented by Formula 2.

In an exemplary embodiment of the present specification, the difference between the LUMO energy level of the hole transporting material represented by Formula 2 and the LUMO energy level of the carbazole derivative represented by Formula 1 is 0.5 eV or more.

The lowest unoccupied molecular orbital (LUMO) energy level of the hole transporting material according to an exemplary embodiment of the present specification is closer to the vacuum level (0 ev) than the LUMO energy level of the carbazole derivative represented by Formula 1, which is included in the light emitting layer.

In this case, electrons injected from the cathode may be prevented from flowing from the light emitting layer to the hole transporting layer, and the electrons may be concentrated relatively in the portion adjacent to the hole transporting layer/the light emitting layer. Therefore, excitons may be produced uniformly within the light emitting layer as a whole by moving the exciton production position in the light emitting layer from the interface between the light emitting layer and the electron transporting layer to the interface between the hole transporting layer and the light emitting layer. When the exciton production region becomes distant from the interface between the light emitting layer and the electron transporting layer, the amount of holes injected into the light emitting layer may be relatively reduced to prevent aggregation (EPIA; exciton-polaron-induced aggregation) of excitons produced within the light emitting layer and positive polarons.

That is, the electrons injected from the cathode may be transferred to the interface between the hole transporting layer and the light emitting layer to uniformly distribute the exciton production region throughout the light emitting layer and increase the probability of producing excitons in the light emitting layer. In this case, electrons may flow into the electron transporting layer while failing to contribute to the light emitting layer, and thus reduces the probability that non-radiatively decayed excitons are produced, so that it is possible to expect that the efficiency of the organic light emitting diode is improved. In addition, excitons may be concentrated in a portion to prevent aging of a specific portion in the light emitting layer from being accelerated, so that it is possible to expect that the service life of the organic light emitting diode is improved.

In the present specification, the energy level means the size of energy. Accordingly, even when the energy level is expressed in the negative (−) direction from the vacuum level, it is interpreted that the energy level means an absolute value of the corresponding energy value. For example, the HOMO energy level means the distance from the vacuum level to the highest occupied molecular orbital. Further, the LUMO energy level means the distance from the vacuum level to the lowest unoccupied molecular orbital.

For the measurement of the HOMO energy level in the present specification, it is possible to use a UV photoelectron spectroscopy (UPS) for measuring the ionization potential of the material by irradiating UV on the surface of the thin film and detecting electrons jumping out in this case. Otherwise, for the measurement of the HOMO energy level, it is possible to use a cyclic voltammetry (CV) for dissolving a material to be measured along with the electrolyte in a solvent, and then measuring the oxidation potential through the voltage sweep. Furthermore, it is possible to use a method of photoemission yield spectrometer in air (PYSA), which measures the ionization potential in the atmosphere by using a machine of AC-3 (manufactured by RKI Instruments, Inc.).

Specifically, the HOMO energy level of the present specification was measured by vacuum depositing a target material to have a thickness of 50 nm or more on an ITO substrate, and then using AC-3 measuring instrument (manufactured by RKI Instruments, Inc.). Further, for the LUMO energy level, the absorption spectrum (abs.) and photoluminescence spectrum (PL) of the sample prepared above were measured, and then each spectrum edge energy was calculated, the difference was taken as a bandgap (Eg), and the LUMO energy level was calculated as a value obtained by subtracting the bandgap difference from the HOMO energy level measured from the AC-3.

In the present specification, the LUMO energy level may be obtained through the measurement of inverse photoelectron spectroscopy (IPES) or electrochemical reduction potential. The IPES is a method for determining the LUMO energy level by irradiating electron beam on a thin film, and measuring light emitting in this case. In addition, for the measurement of electrochemical reduction potential, a measurement target material is dissolved along with the electrolyte in a solvent, and then the reduction potential may be measured through the voltage sweep. Otherwise, the LUMO energy level may be calculated by using the HOMO energy level and a singlet energy level obtained by measuring the UV absorption degree of the target material.

In an exemplary embodiment of the present specification, the difference between the LUMO energy level of the carbazole derivative represented by Formula 1 and included in the light emitting layer, which is measured by the method of photoemission yield spectrometer in air (PYSA), and the LUMO energy level of the spiro compound represented by Formula 2 and included in the hole transporting layer, which is measured by the method of photoemission yield spectrometer in air (PYSA), is 0.5 eV or more.

In an exemplary embodiment of the present specification, the hole mobility of the hole transporting material represented by Formula 2 is $5 \times 10^{-4}$ cm$^2$/Vs or less. In one exemplary embodiment, the hole mobility of the hole transporting material is $5 \times 10^{-4}$ cm$^2$/Vs or less under an electric field condition of 0.1 MV/cm. In another exemplary embodiment, the hole mobility of the hole transporting material is $10^{-4}$ cm$^2$/Vs or less.

The hole mobility may be measured by a method used in the art. Specifically, a time of flight (TOF) or a method of measuring a space charge limited current (SCLC) may be used, and the method is not limited thereto. In the present specification, the hole mobility may be measured by setting the film thickness of the material to 1000 nm or more in order to measure the space charge limited current (SCLC).

When the hole transporting material having the hole mobility in the range is included, the probability of a positive polaron, which may be bonded to excitons, is decreased, and thus, it may be advantageous in improving the service life of the diode.

In an exemplary embodiment of the present specification, the hole mobility of the hole transporting material included in the hole transporting layer, which is measured by time of flight (TOF), is $5 \times 10^{-4}$ cm$^2$/Vs or less.

In an exemplary embodiment of the present specification, a sample was prepared by heating hexanitrile hexaazatriphenylene on an ITO substrate under vacuum to be deposited to have a thickness of 5 nm, depositing the hole transporting material included in the hole transporting layer to have a thickness of 200 nm, and then depositing aluminum to have a thickness of 100 nm or more. The mobility in the space charge limited current (SCLC) region may be calculated by measuring the current density (mA/cm$^2$) of the sample for the voltage.

In an exemplary embodiment of the present specification, the light emitting layer includes: a host including the carbazole derivative represented by Formula 1; and a dopant.

In an exemplary embodiment of the present specification, the organic light emitting diode emits red light.

The organic light emitting diode according to an exemplary embodiment of the present specification is a phosphorescent organic light emitting diode.

In an exemplary embodiment of the present specification, when the organic light emitting diode includes a red phosphorescent light emitting dopant, the carbazole derivative represented by Formula 1, which is included in the light emitting layer and has a triplet energy level of 2.5 eV or less, is adjacent to the triplet energy state, and thus, a high light emitting efficiency may be expected.

The organic light emitting diode according to one exemplary embodiment emits red phosphorescence.

Examples of the substituents will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means that a group is substituted with one or two or more substituents selected from the group consisting of deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group or is substituted with a substituent to which two or more substituents are linked among the substituents exemplified above, or has no substituent. For example, "the substituent to which two or more substituents are linked" may be a biphenyl group. That is, the biphenyl group may also be an aryl group, and may be interpreted as a substituent to which two phenyl groups are linked.

In the present specification,

means a moiety bonded to another substituent.

In the present specification, the halogen group may be fluorine, chlorine, bromine, or iodine.

In the present specification, the number of carbon atoms of the imide group is not particularly limited, but is preferably 1 to 25. Specifically, the imide group may be a compound having the following structure, but is not limited thereto.

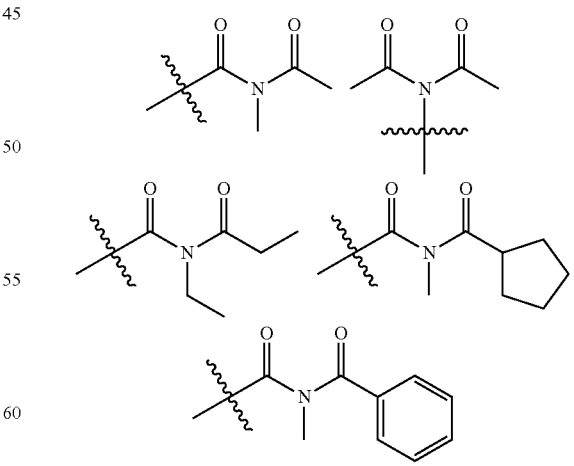

In the present specification, for the amide group, one or two nitrogen atoms of the amide group may be substituted with hydrogen, a straight-chained, branched, or cyclic alkyl group having 1 to 25 carbon atoms, or an aryl group having 6 to 25 carbon atoms. Specifically, the amide group may be a compound having the following structural formula, but is not limited thereto.

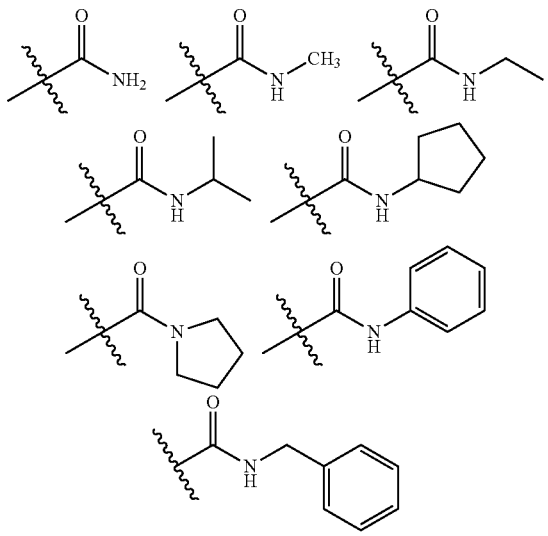

In the present specification, the alkyl group may be straight-chained or branched, and the number of carbon atoms thereof is not particularly limited, but is preferably 1 to 50. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethylpropyl, isohexyl, 2-methylpentyl, 4-methylhexyl, 5-methylhexyl, and the like, but are not limited thereto.

In the present specification, the cycloalkyl group is not particularly limited, but is preferably a cycloalkyl group having 3 to 60 carbon atoms, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight-chained, branched, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, the alkenyl group may be straight-chained or branched, and the number of carbon atoms thereof is not particularly limited, but is preferably 2 to 40. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(di-phenyl-1-yl)vinyl-1-yl, a stilbenyl group, a styrenyl group, and the like, but are not limited thereto.

In the present specification, specific examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, the aryl group may be a monocyclic aryl group or a polycyclic aryl group, and includes the case where an alkyl group having 1 to 25 carbon atoms or an alkoxy group having 1 to 25 carbon atoms is substituted. Further, the aryl group in the present specification may mean an aromatic ring.

When the aryl group is a monocyclic aryl group, the number of carbon atoms thereof is not particularly limited, but is preferably 6 to 25. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 24. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may combine with each other to form a ring.

When the fluorenyl group is substituted, the substituent may be

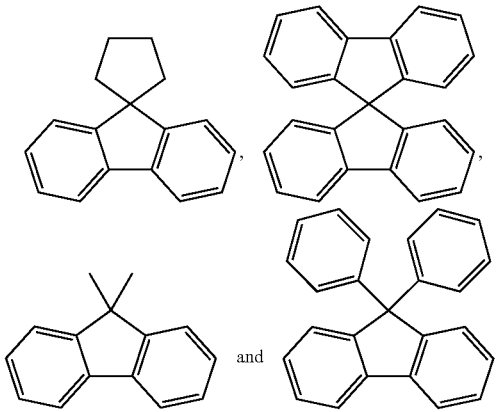

However, the fluorenyl group is not limited thereto.

In the present specification, the heterocyclic group includes one or more of an atom other than carbon and a heteroatom, and specifically, the heteroatom may include one or more atoms selected from the group consisting of O, N, Se, and S, and the like. The number of carbon atoms thereof is not particularly limited, but is preferably 2 to 60. Examples of the heterocyclic group include a thiophene group, a furan group, a pyrrole group, an imidazole group, a triazole group, an oxazole group, an oxadiazole group, a pyridyl group, a bipyridyl group, a pyrimidyl group, a triazine group, a triazole group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present specification, the heterocyclic group including one or more of N and S atoms may be selected from the definition of the heterocyclic group.

The heterocyclic group may be monocyclic or polycyclic, and may be an aromatic ring, an aliphatic ring, or a condensed ring of the aromatic ring and the aliphatic ring.

In the present specification, examples of the arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The two or more arylamine groups which the aryl group includes may include a monocyclic aryl group, a polycyclic aryl group, or both a monocyclic aryl group and a polycyclic aryl group.

Specific examples of the arylamine group include phenylamine, naphthylamine, biphenylamine, anthracenylamine, 3-methyl-phenylamine, 4-methyl-naphthylamine, 2-methyl-biphenylamine, 9-methyl-anthracenylamine, a diphenylamine group, a phenylnaphthylamine group, a ditolylamine group, a phenyltolylamine group, carbazole, a triphenylamine group, and the like, but are not limited thereto.

In the present specification, the heteroaryl group in the heteroarylamine group may be selected from the above-described examples of the heterocyclic group.

In the present specification, the aryl group in the aryloxy group, the arylthioxy group, the arylsulfoxy group, and the aralkylamine group is the same as the above-described examples of the aryl group. Specifically, examples of the aryloxy group include phenoxy, p-tolyloxy, m-tolyloxy, 3,5-dimethyl-phenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, 9-phenanthryloxy, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but are not limited thereto.

In the present specification, the alkyl group in the alkylthioxy group and the alkylsulfoxy group is the same as the above-described examples of the alkyl group. Specifically, examples of the alkylthioxy group include a methylthioxy group, an ethylthioxy group, a tert-butylthioxy group, a hexylthioxy group, an octylthioxy group, and the like, and examples of the alkylsulfoxy group include mesyl, an ethylsulfoxy group, a propylsulfoxy group, a butylsulfoxy group, and the like, but are not limited thereto.

In the present specification, the arylene group means that there are two bonding positions in an aryl group, that is, a divalent group. The above-described description on the aryl group may be applied, except that these are each a divalent group.

In the present specification, the meaning that R10 and R20 form a ring means that R10 and R20 combine with each other to form a hydrocarbon ring or a hetero ring, and may mean that an alkylene, which is unsubstituted or substituted with a hydrocarbon or a hetero ring, or an alkenylene, which is unsubstituted or substituted with a hydrocarbon or a hetero ring, may combine with each other to form a ring.

In the present specification, the hydrocarbon ring may be an aliphatic ring, an aromatic ring, or a condensed ring of the aromatic ring and the aliphatic ring, and may be selected from the examples of the cycloalkyl group or the aryl group, except for the hydrocarbon ring which is not monovalent. The hetero ring may be an aliphatic ring, an aromatic ring, or a condensed ring of the aromatic ring and the aliphatic ring, and may be selected from the examples of the heterocyclic group, except for the hetero ring which is not monovalent.

In an exemplary embodiment of the present specification, R3 and R4 combine with each other to form a substituted or unsubstituted aromatic ring.

In another exemplary embodiment, R3 and R4 combine with each other to form a substituted or unsubstituted benzene ring.

In an exemplary embodiment of the present specification, the carbazole derivative represented by Formula 1 is represented by the following Formula 1-1.

In an exemplary embodiment of the present specification, the light emitting layer includes: a host including a carbazole derivative represented by the following Formula 1-1; and a dopant.

[Formula 1-1]

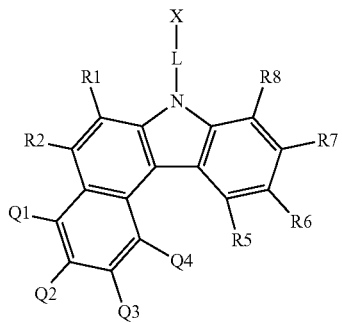

In Formula 1-1,

L, X, R1, R2, and R5 to R8 are the same as those defined in Formula 1,

Q1 to Q4 are the same as or different from each other, and are each independently hydrogen; deuterium; a substituted or unsubstituted aryl group; or a substituted or unsubstituted heterocyclic group, at least one of R1, R2, R5 to R8, and Q1 to Q4 is -L1-A, and L1 and A are the same as those defined in Formula 1.

According to an exemplary embodiment of the present specification, L is a direct bond; or a substituted or unsubstituted phenylene group, and X is a triazine group which is unsubstituted or substituted with an aryl group; a pyrimidine group which is unsubstituted or substituted with an aryl group; or a quinazoline group which is unsubstituted or substituted with an aryl group.

In an exemplary embodiment of the present specification, X is a triazine group; a pyrimidine group; or a quinazoline group, and the triazine group; the pyrimidine group; and the quinazoline group are each independently unsubstituted or substituted with one or two or more substituents selected from the group consisting of a phenyl group; a naphthyl group; and a biphenyl group.

In an exemplary embodiment of the present specification, L is a direct bond.

In one exemplary embodiment, L is a substituted or unsubstituted phenylene group.

In another exemplary embodiment, L is a phenylene group.

In an exemplary embodiment of the present specification, X is a triazine group which is unsubstituted or substituted with an aryl group.

In one exemplary embodiment, X is a triazine group which is substituted with a phenyl group.

In an exemplary embodiment of the present specification, X is a pyrimidine group which is unsubstituted or substituted with an aryl group.

In one exemplary embodiment, X is a pyrimidine group which is substituted with a phenyl group.

In an exemplary embodiment of the present specification, X is a quinazoline group which is unsubstituted or substituted with an aryl group.

In another exemplary embodiment, X is a quinazoline group which is substituted with a phenyl group.

In another exemplary embodiment, X is a quinazoline group which is substituted with a biphenyl group.

In another exemplary embodiment, X is a quinazoline group which is substituted with a naphthyl group.

In an exemplary embodiment of the present specification, the -L-X is selected from the following structures.

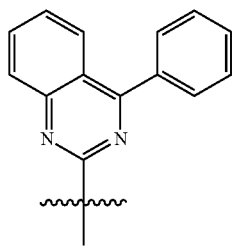

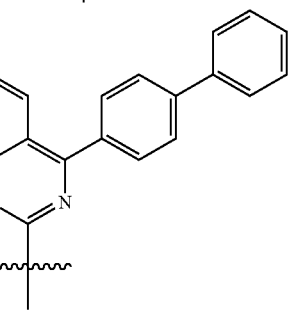

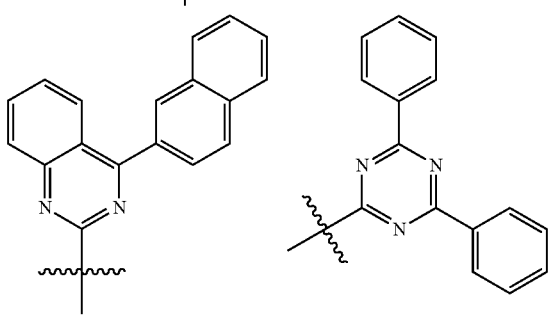

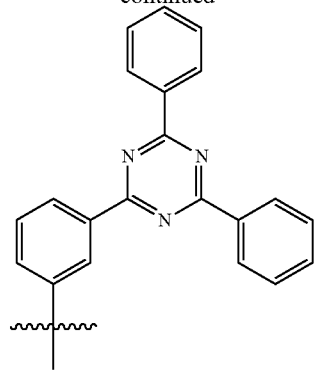

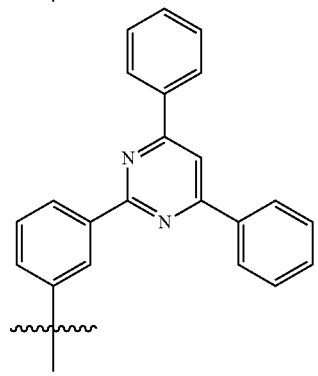

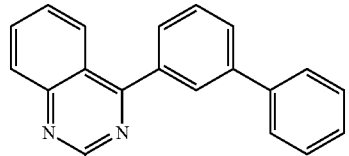

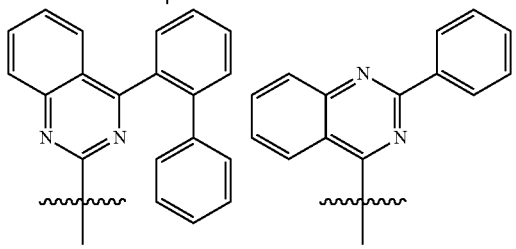

In an exemplary embodiment of the present specification, R1 is hydrogen.

In one exemplary embodiment, R2 is hydrogen.

In another exemplary embodiment, R2 is -L1-A.

In one exemplary embodiment, R3 is hydrogen.

In another exemplary embodiment, R4 is hydrogen.

In an exemplary embodiment of the present specification, R5 is hydrogen.

In an exemplary embodiment of the present specification, R6 is hydrogen.

In another exemplary embodiment of the present specification, R6 is -L1-A.

In one exemplary embodiment, R7 is hydrogen.

In another exemplary embodiment, R7 is -L1-A.

In still another exemplary embodiment, R8 is hydrogen.

In an exemplary embodiment of the present specification, Q1 is hydrogen.

In one exemplary embodiment, Q2 is hydrogen.

In another exemplary embodiment, Q2 is -L1-A.

In an exemplary embodiment of the present specification, Q3 is hydrogen.

In another exemplary embodiment of the present specification, Q3 is -L1-A.

In an exemplary embodiment of the present specification, Q4 is hydrogen.

In an exemplary embodiment of the present specification, L1 is a direct bond; or a substituted or unsubstituted arylene group, and A is a heterocyclic group including one or more of substituted or unsubstituted N and S atoms.

In an exemplary embodiment of the present specification, L1 is a direct bond; or a substituted or unsubstituted arylene group having 6 to 30 carbon atoms, and A is a heterocyclic group having 2 to 30 carbon atoms, which includes one or more of substituted or unsubstituted N and S atoms.

According to an exemplary embodiment of the present specification, L is a direct bond; or a substituted or unsubstituted phenylene group, and A is a substituted or unsubstituted carbazole group; a substituted or unsubstituted thiophene group; or a substituted or unsubstituted dibenzothiophene group.

In an exemplary embodiment of the present specification, L is a direct bond; or a phenylene group which is unsubstituted or substituted with an aryl group, and A is a carbazole group which is unsubstituted or substituted with an aryl group; a thiophene group which is unsubstituted or substituted with an aryl group; or a dibenzothiophene group which is unsubstituted or substituted with an aryl group.

In one exemplary embodiment, L1 is a direct bond.

In one exemplary embodiment, L1 is a substituted or unsubstituted phenylene group.

In an exemplary embodiment of the present specification, L1 is a phenylene group.

In an exemplary embodiment of the present specification, A is a heterocyclic group including a substituted or unsubstituted N atom.

In one exemplary embodiment, A is a substituted or unsubstituted carbazole group.

In another exemplary embodiment, A is a carbazole group which is substituted or unsubstituted with an aryl group.

In still another exemplary embodiment, A is a carbazole group which is substituted with a phenyl group.

In an exemplary embodiment of the present specification, A is a carbazole group which is substituted with a biphenyl group.

In still another exemplary embodiment, A is an unsubstituted carbazole group.

In an exemplary embodiment of the present specification, A is a heterocyclic group including a substituted or unsubstituted S atom.

In one exemplary embodiment, A is a substituted or unsubstituted dibenzothiophene group.

In another exemplary embodiment, A is a dibenzothiophene group.

In another exemplary embodiment of the present specification, A is a substituted or unsubstituted thiophene group.

In one exemplary embodiment, A is a thiophene group which is substituted with an aryl group.

In another exemplary embodiment, A is a thiophene group which is substituted with a phenyl group.

In an exemplary embodiment of the present specification, the -L1-A is selected from the following structures.

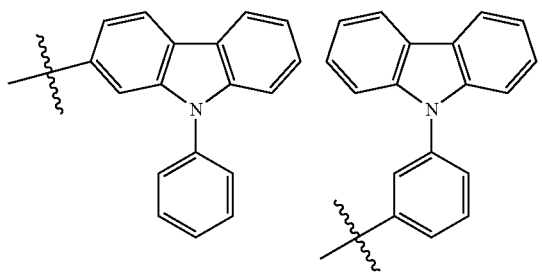

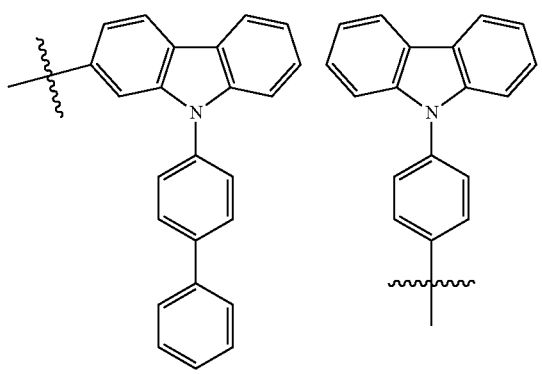

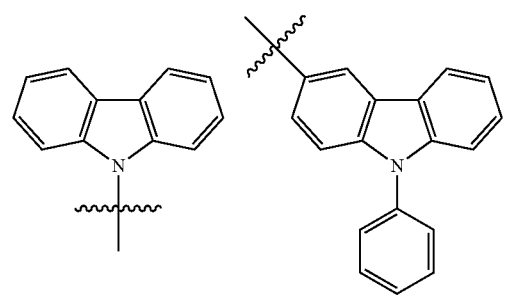

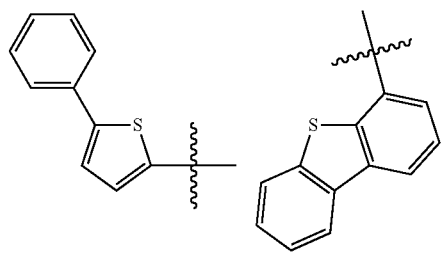

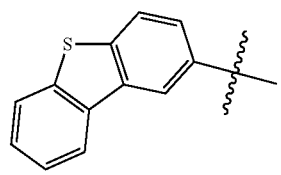

In an exemplary embodiment of the present specification, the carbazole derivative represented by Formula 1 is represented by any one of the following Formulae 1-1-1 to 1-1-50.

Formula 1-1-1
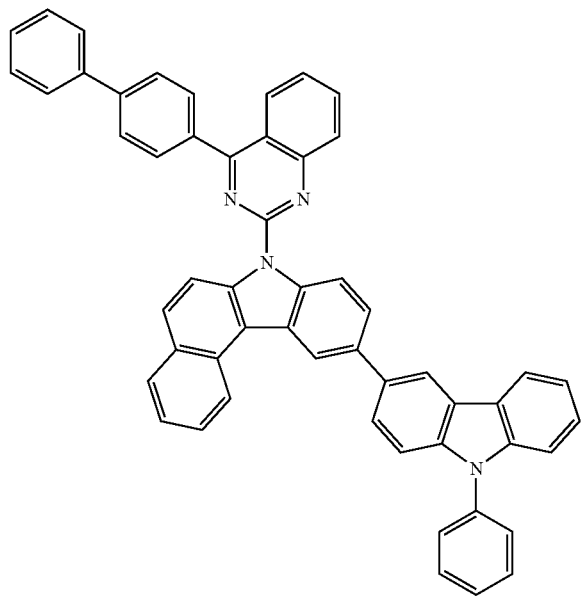
Formula 1-1-2
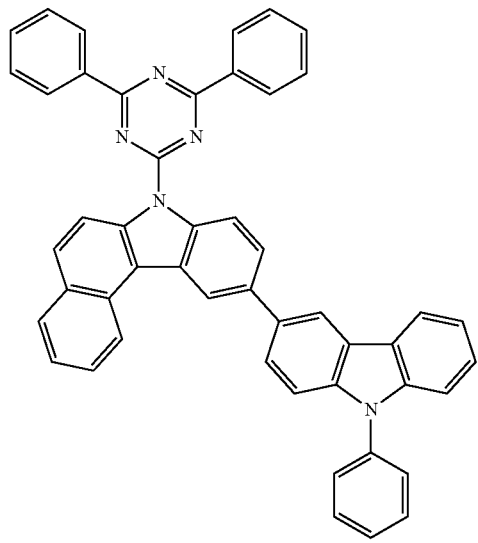
Formula 1-1-3
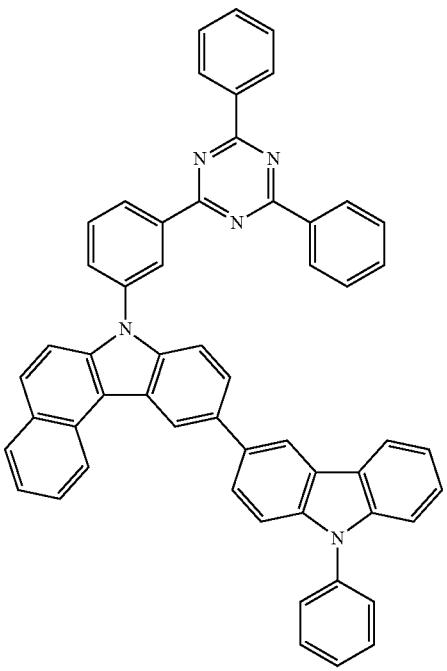
Formula 1-1-4
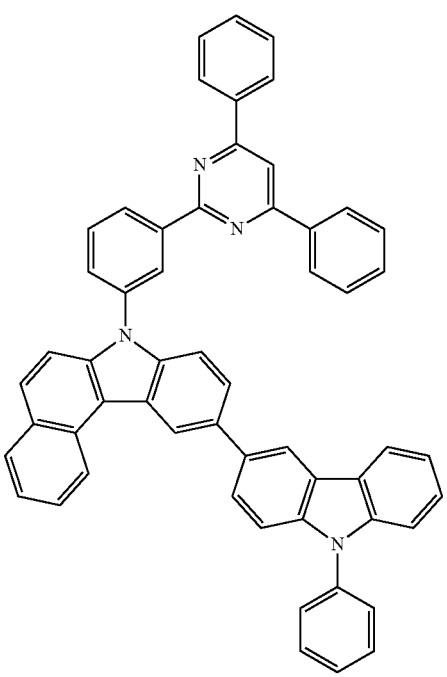

Formula 1-1-5
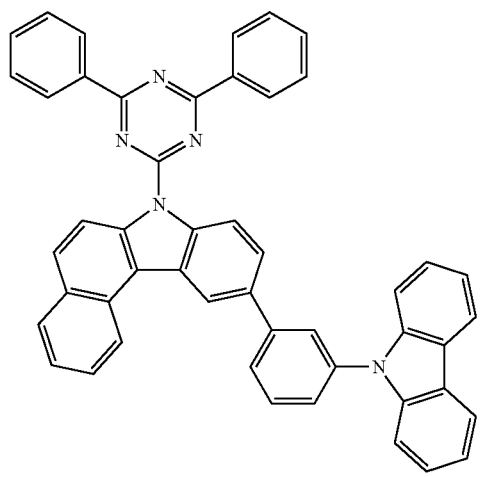
Formula 1-1-6
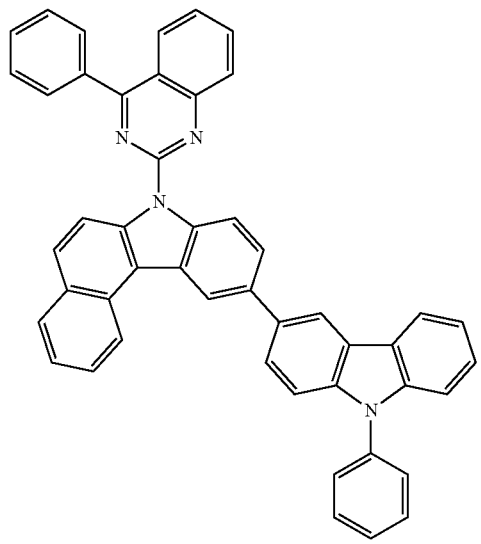
Formula 1-1-7
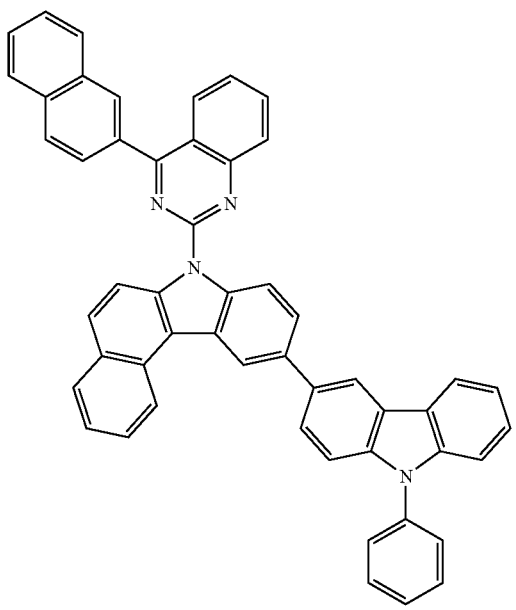
Formula 1-1-8
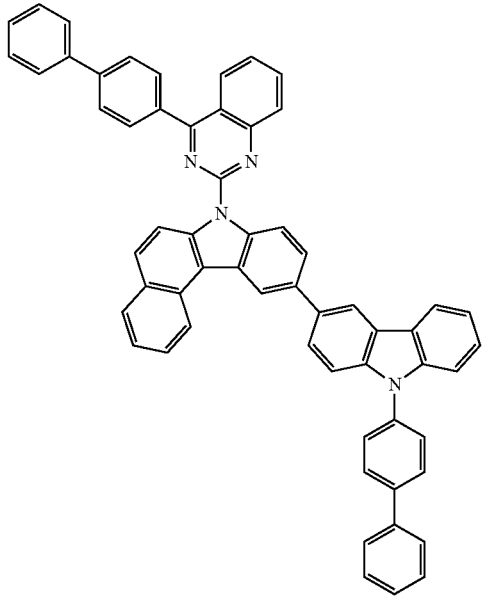

Formula 1-1-9
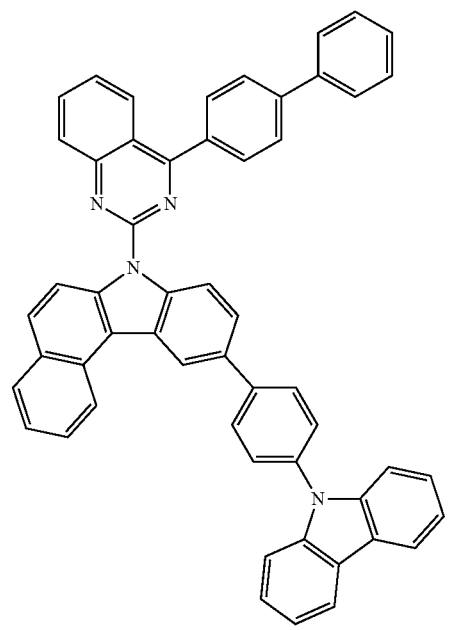
Formula 1-1-10
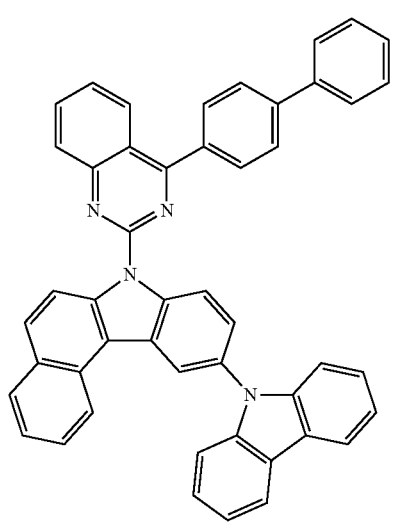
Formula 1-1-11
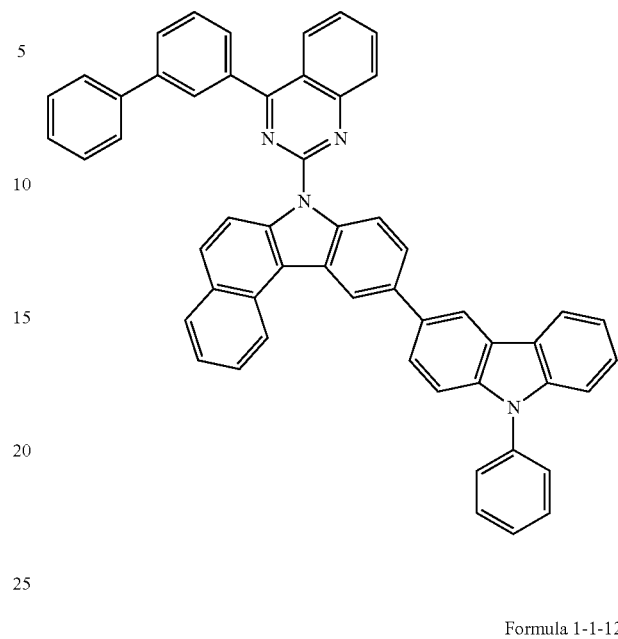
Formula 1-1-12
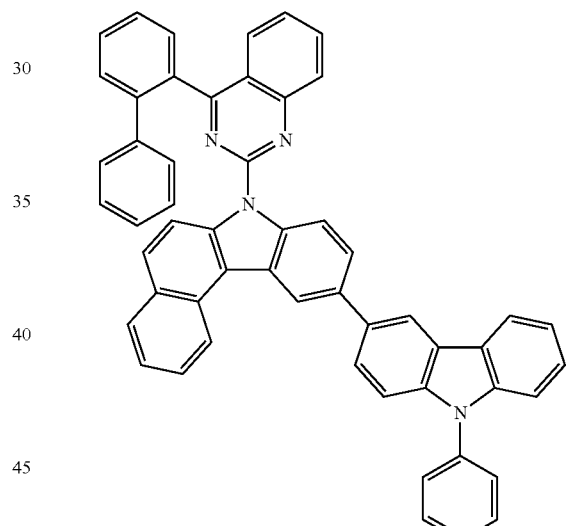
Formula 1-1-13
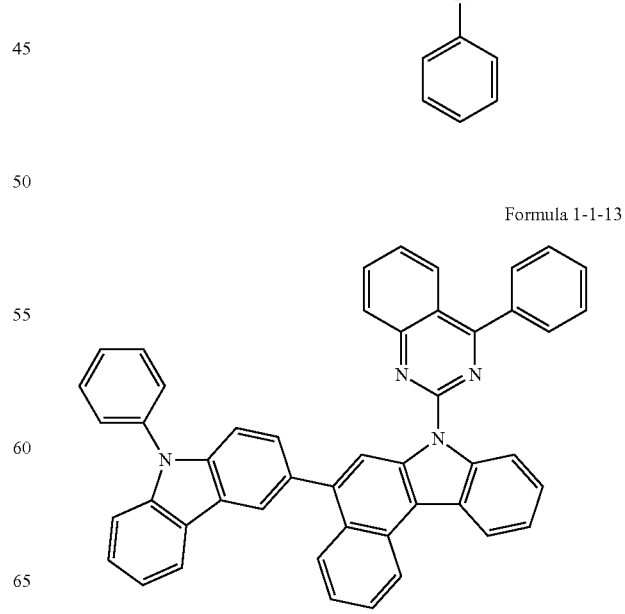

Formula 1-1-14
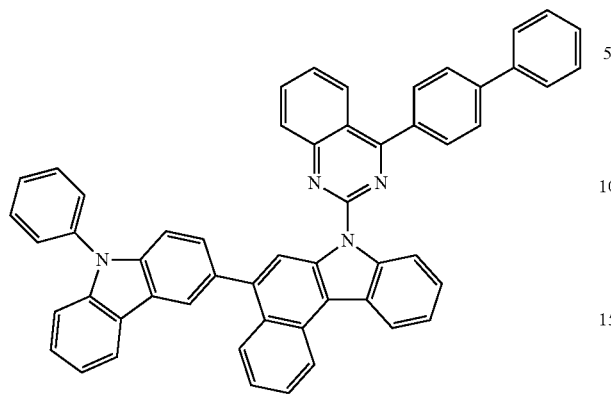
Formula 1-1-15
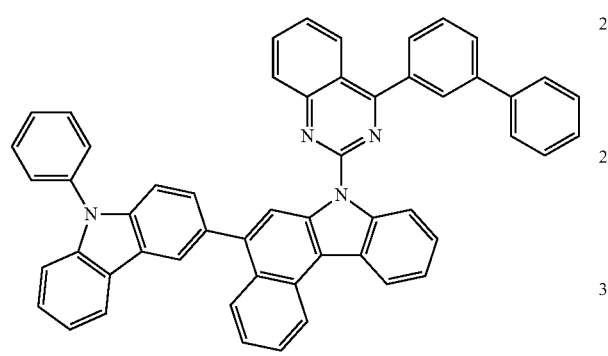
Formula 1-1-16
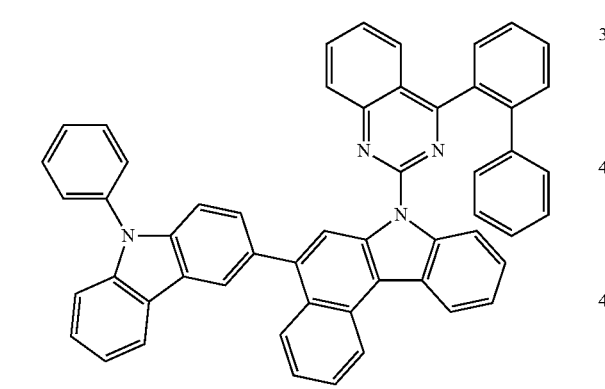
Formula 1-1-17
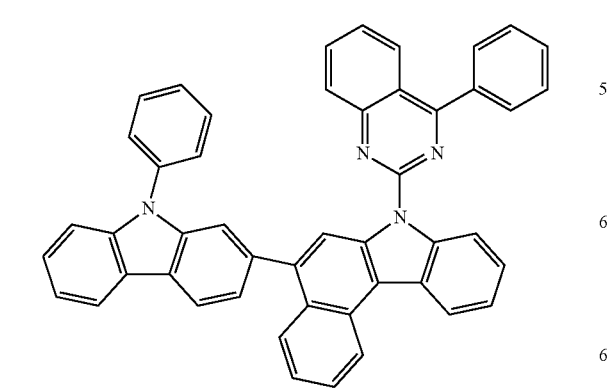
Formula 1-1-18
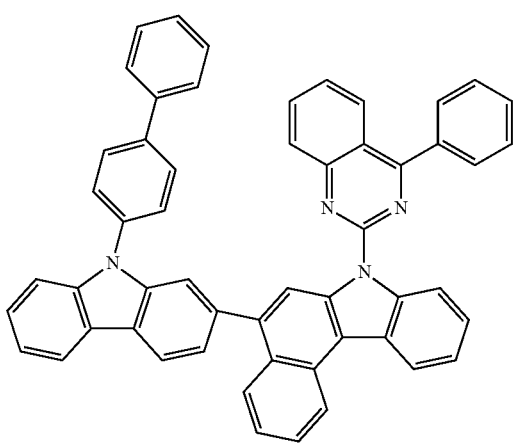
Formula 1-1-19
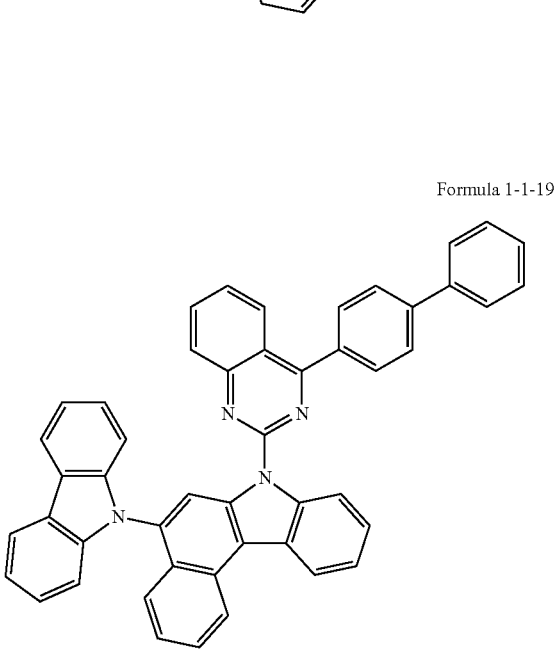
Formula 1-1-20
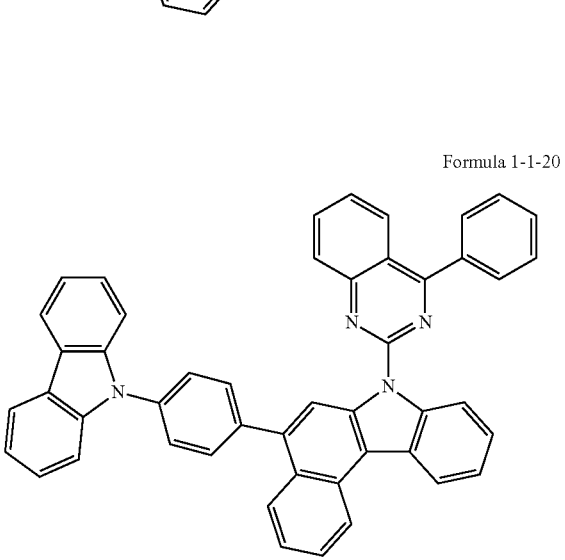

Formula 1-1-21
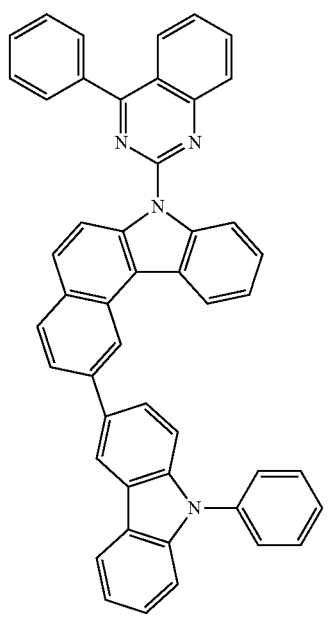
Formula 1-1-22
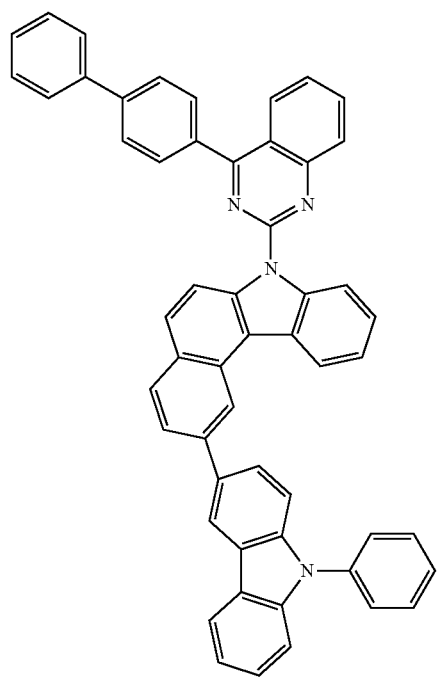
Formula 1-1-23
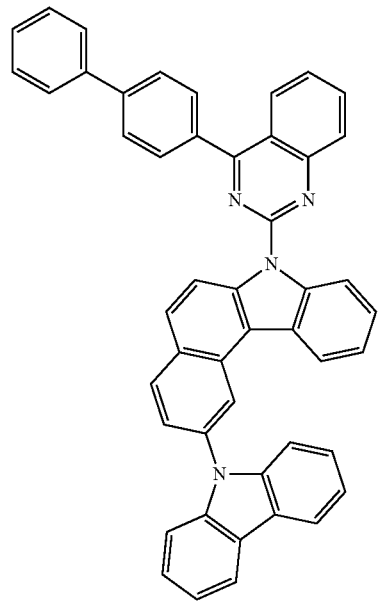
Formula 1-1-24
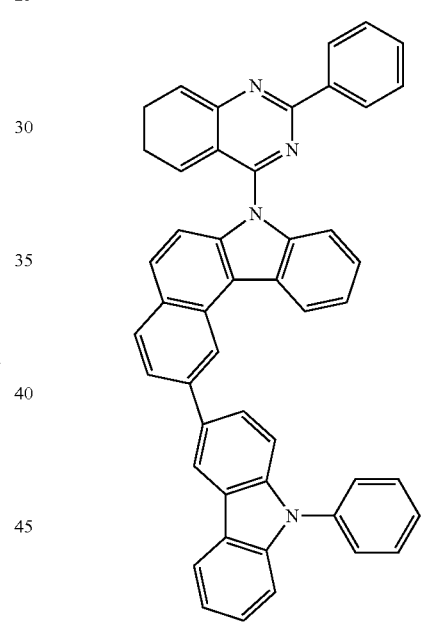
Formula 1-1-25
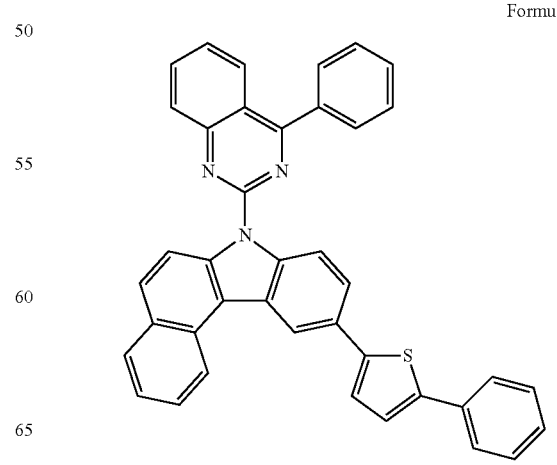

-continued
Formula 1-1-26
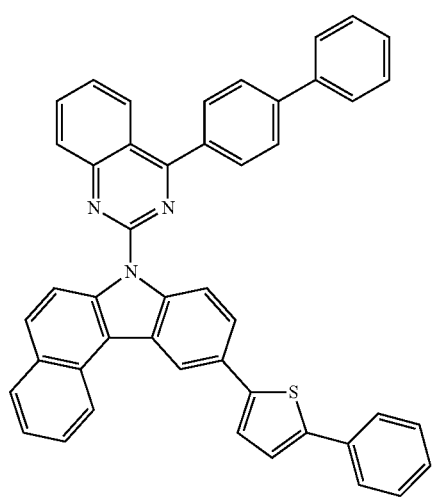
Formula 1-1-27
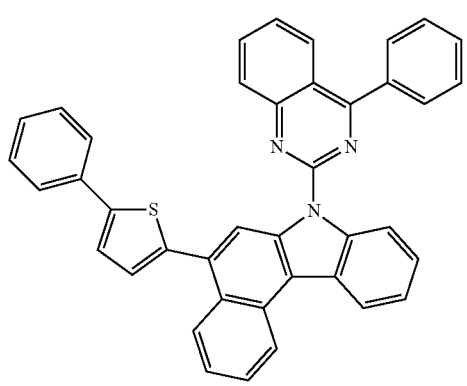
Formula 1-1-28
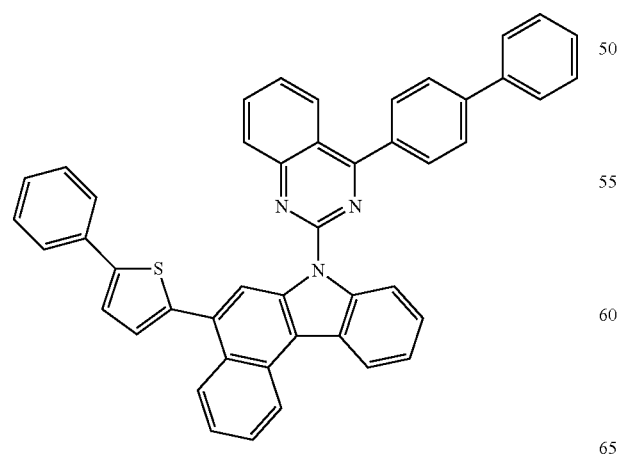
Formula 1-1-29
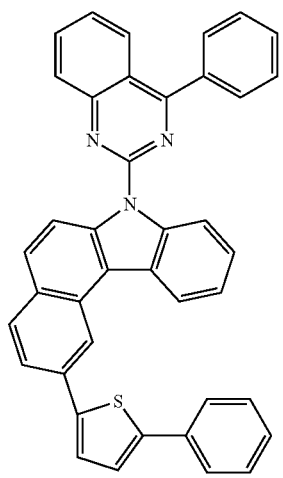
Formula 1-1-30
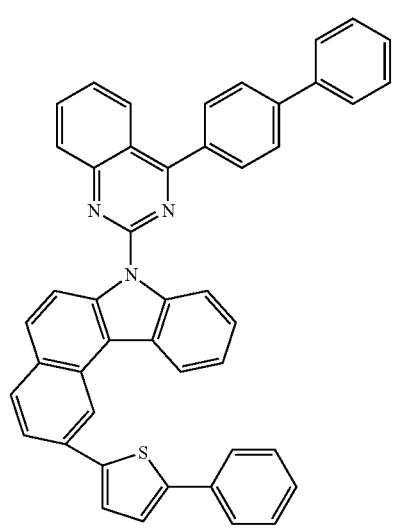
Formula 1-1-31
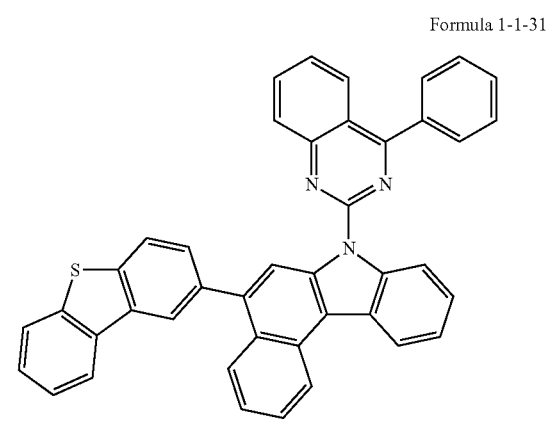

Formula 1-1-32
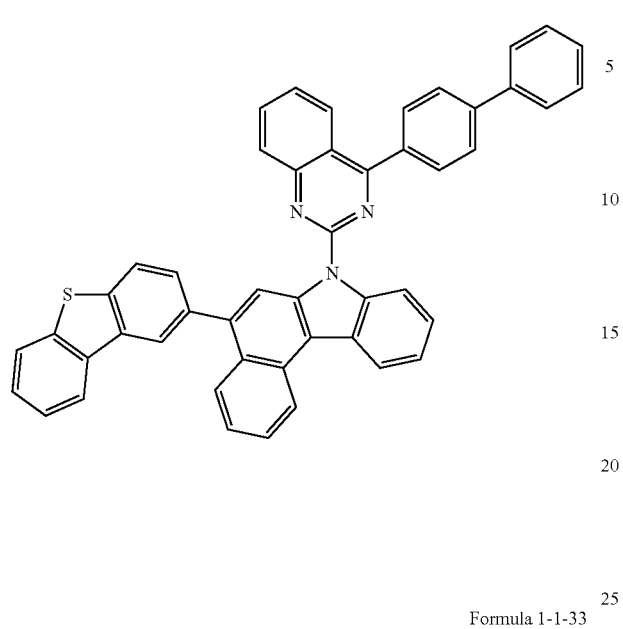
Formula 1-1-33
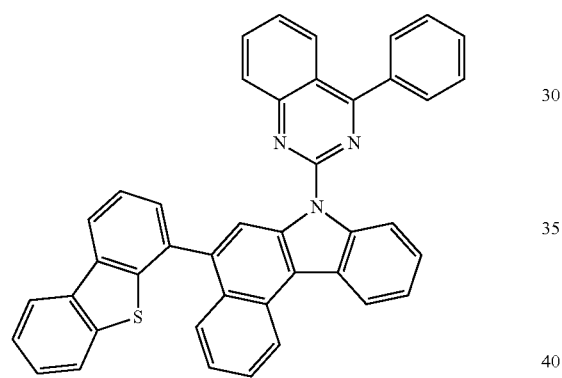
Formula 1-1-34
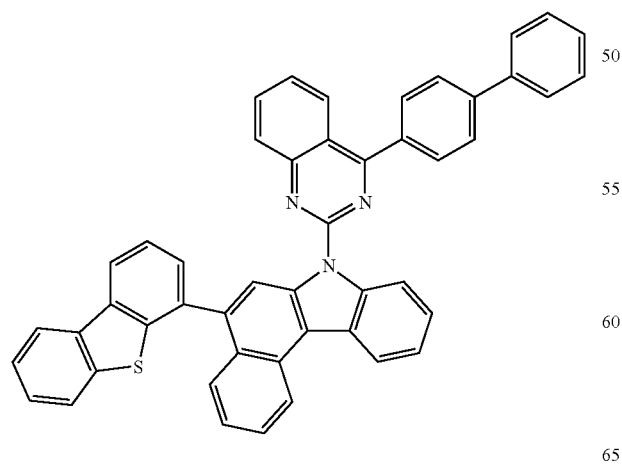
Formula 1-1-35
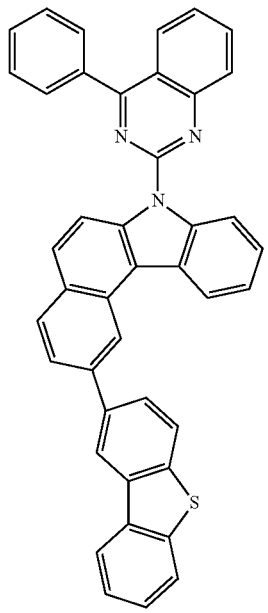
Formula 1-1-36
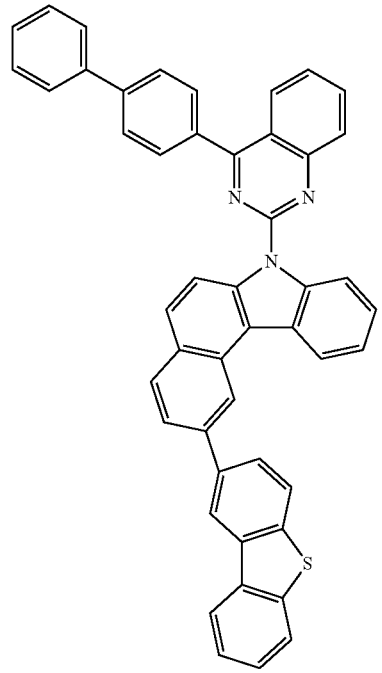

Formula 1-1-37
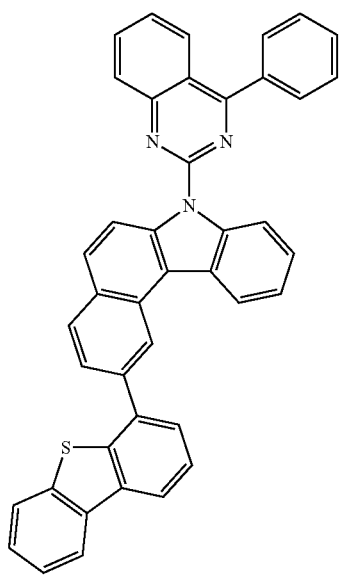
Formula 1-1-38
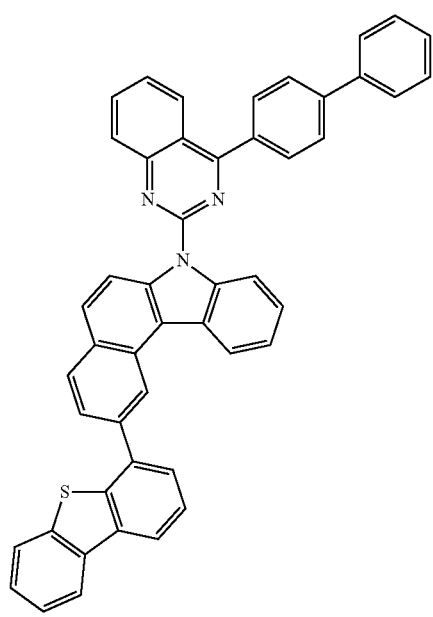
Formula 1-1-39
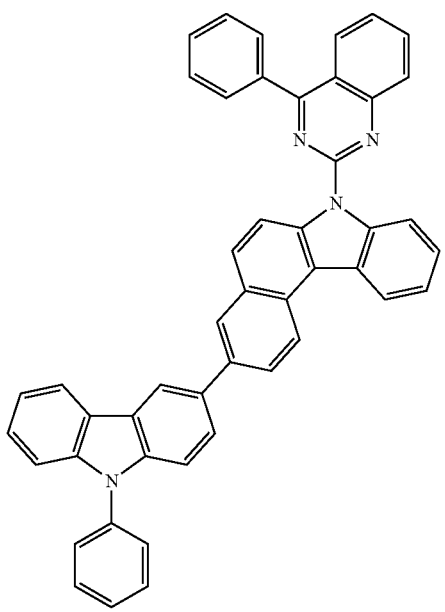
Formula 1-1-40
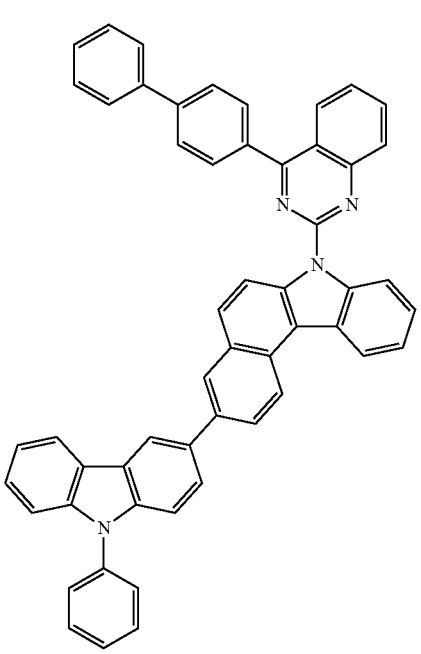

Formula 1-1-41
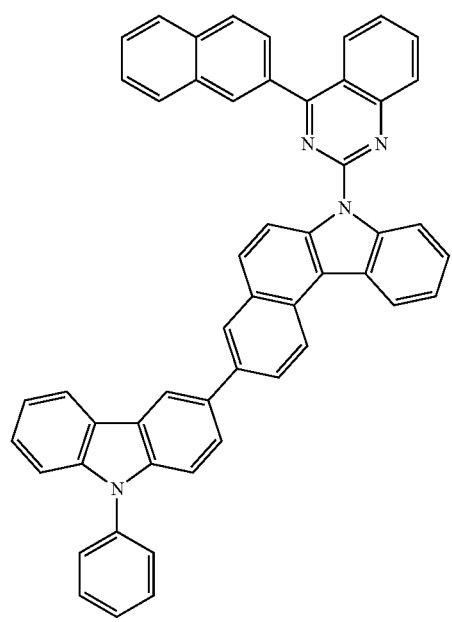
Formula 1-1-42
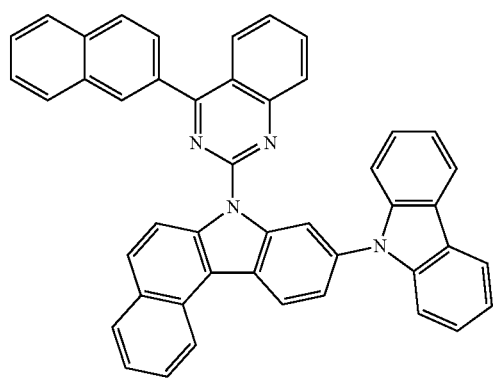
Formula 1-1-43
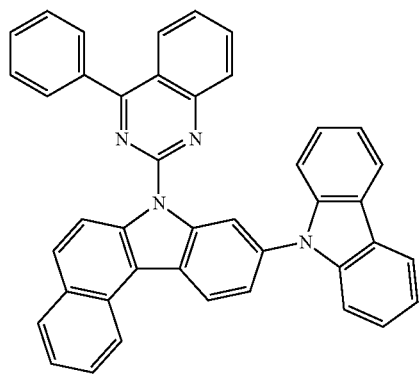
Formula 1-1-44
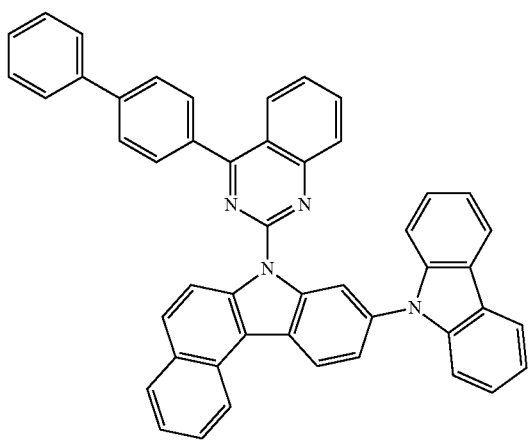
Formula 1-1-45
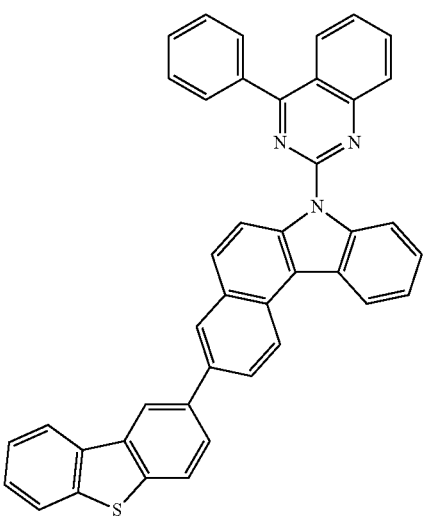
Formula 1-1-46
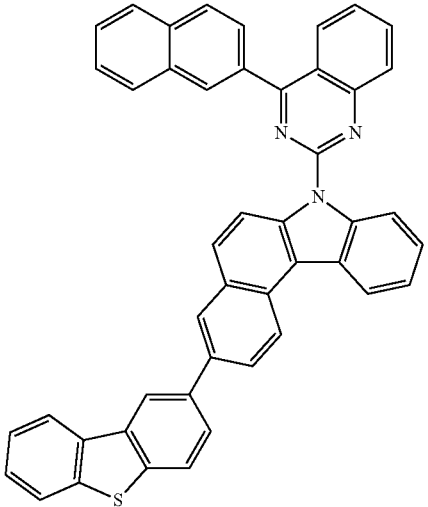

Formula 1-1-47

Formula 1-1-48

Formula 1-1-49

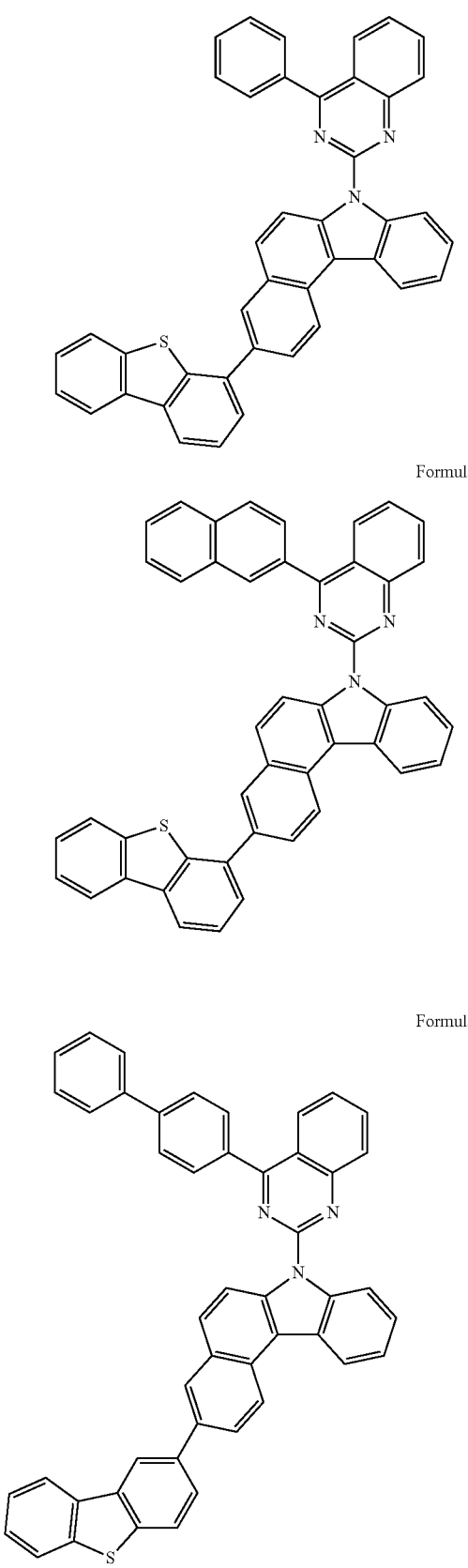

Formula 1-1-50

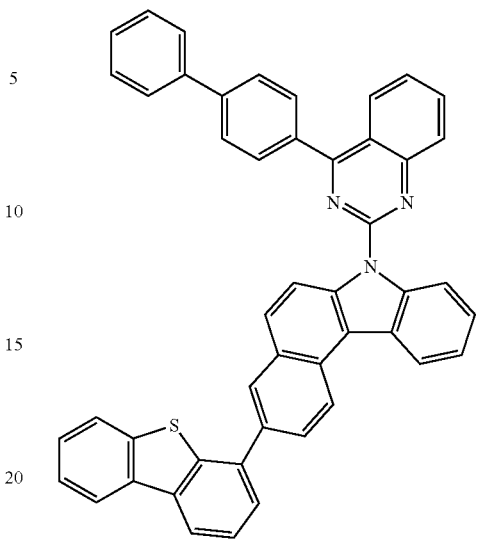

In an exemplary embodiment of the present specification, R10 to R20 are hydrogen.

In an exemplary embodiment of the present specification, at least one of A2 and A2 is a carbazole group which is unsubstituted or substituted with an aryl group; or —NZ1Z2, and Z1 and Z2 are the same as or different from each other, and are each independently a substituted or unsubstituted aryl group.

In an exemplary embodiment of the present specification, Y1 is a direct bond.

In another exemplary embodiment, Y2 is a direct bond.

In an exemplary embodiment of the present specification, A1 is hydrogen.

In an exemplary embodiment of the present specification, A1 is a substituted or unsubstituted carbazole group.

In another exemplary embodiment, A1 is a carbazole group which is substituted with an aryl group.

In an exemplary embodiment of the present specification, A1 is a carbazole group which is unsubstituted or substituted with an aryl group having 6 to 30 carbon atoms.

In another exemplary embodiment, A1 is a carbazole group which is substituted with a phenyl group.

In an exemplary embodiment of the present specification, A1 is a carbazole group which is substituted with an aryl group, and in the carbazole group, the No. 2 carbon position of the carbazole group is linked to Formula 2.

In an exemplary embodiment of the present specification, A1 is a carbazole group which is substituted with an aryl group having 6 to 30 carbon atoms, and in the carbazole group, the No. 2 carbon position of the carbazole group is linked to Formula 2.

In another exemplary embodiment, A1 is a carbazole group which is substituted with an aryl group, and in the carbazole group, the No. 3 carbon position of the carbazole group is linked to Formula 2.

In still another exemplary embodiment, A1 is a carbazole group which is substituted with an aryl group having 6 to 30 carbon atoms, and in the carbazole group, the No. 3 carbon position of the carbazole group is linked to Formula 2.

In an exemplary embodiment of the present specification, A1 is a carbazole group.

In another exemplary embodiment, A1 is a carbazole group, and in the carbazole group, the N atom of the carbazole group is linked to Formula 2.

In another exemplary embodiment of the present specification, A1 is —NZ1Z2.

In an exemplary embodiment of the present specification, A2 is hydrogen.

In an exemplary embodiment of the present specification, A2 is a substituted or unsubstituted carbazole group.

In one exemplary embodiment, A2 is a carbazole group which is substituted with an aryl group.

In an exemplary embodiment of the present specification, A2 is a carbazole group which is unsubstituted or substituted with an aryl group having 6 to 30 carbon atoms.

In another exemplary embodiment, A2 is a carbazole group which is substituted with a phenyl group.

In an exemplary embodiment of the present specification, A2 is a carbazole group which is substituted with an aryl group, and in the carbazole group, the No. 2 carbon position of the carbazole group is linked to Formula 2.

In an exemplary embodiment of the present specification, A2 is a carbazole group which is substituted with an aryl group having 6 to 30 carbon atoms, and in the carbazole group, the No. 2 carbon position of the carbazole group is linked to Formula 2.

In another exemplary embodiment, A2 is a carbazole group which is substituted with an aryl group, and in the carbazole group, the No. 3 carbon position of the carbazole group is linked to Formula 2.

In still another exemplary embodiment, A2 is a carbazole group which is substituted with an aryl group having 6 to 30 carbon atoms, and in the carbazole group, the No. 3 carbon position of the carbazole group is linked to Formula 2.

In an exemplary embodiment of the present specification, A2 is a carbazole group.

In another exemplary embodiment, A2 is a carbazole group, and in the carbazole group, the N atom of the carbazole group is linked to Formula 2.

In another exemplary embodiment of the present specification, A2 is —NZ1Z2.

In an exemplary embodiment of the present specification, Z1 and Z2 are the same as or different from each other, and are each independently a substituted or unsubstituted aryl group.

In another exemplary embodiment, Z1 and Z2 are the same as or different from each other, and are each independently a substituted or unsubstituted aryl group having 6 to 30 carbon atoms.

In still another exemplary embodiment, Z1 and Z2 are the same as or different from each other, and are each independently one or two or more substituted or unsubstituted aryl groups having 6 to 30 carbon atoms selected from the group consisting of an alkyl group and an aryl group.

In an exemplary embodiment of the present specification, Z1 and Z2 are the same as or different from each other, and are each independently an aryl group which is unsubstituted or substituted with an aryl group.

In an exemplary embodiment of the present specification, Z1 and Z2 are the same as or different from each other, and are each independently an aryl group having 6 to 30 carbon atoms, which is unsubstituted or substituted with an aryl group having 6 to 30 carbon atoms.

In an exemplary embodiment of the present specification, Z1 and Z2 are the same as or different from each other, and are each independently an aryl group which is unsubstituted or substituted with an alkyl group.

In an exemplary embodiment of the present specification, Z1 and Z2 are the same as or different from each other, and are each independently an aryl group having 6 to 30 carbon atoms, which is unsubstituted or substituted with an alkyl group having 1 to 30 carbon atoms.

In one exemplary embodiment, Z1 and Z2 are the same as or different from each other, and are each independently a substituted or unsubstituted phenyl group; a substituted or unsubstituted biphenyl group; a substituted or unsubstituted terphenyl group; a substituted or unsubstituted fluorenyl group; or a substituted or unsubstituted naphthyl group.

In one exemplary embodiment, Z1 and Z2 are the same as or different from each other, and are each independently a phenyl group; a biphenyl group; a terphenyl group; a fluorenyl group which is substituted with an alkyl group; or a naphthyl group.

In an exemplary embodiment of the present specification, at least one of —Y1-A1 and —Y2-A2 is any one of the following structures.

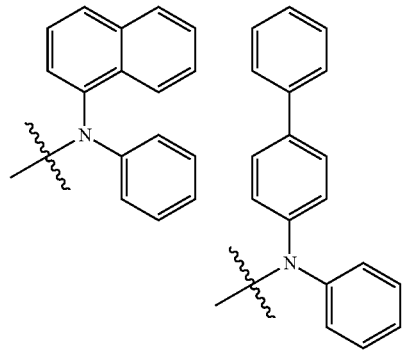

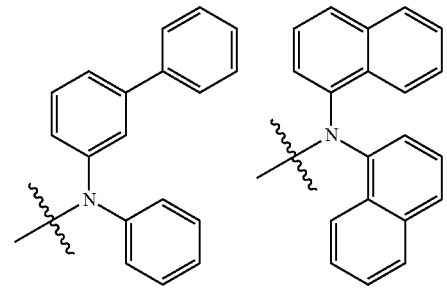

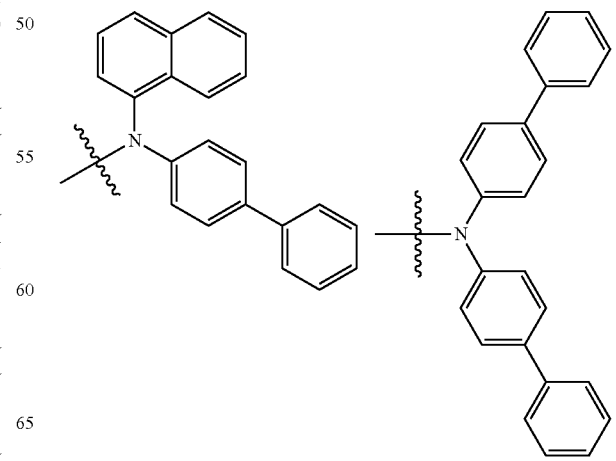

-continued
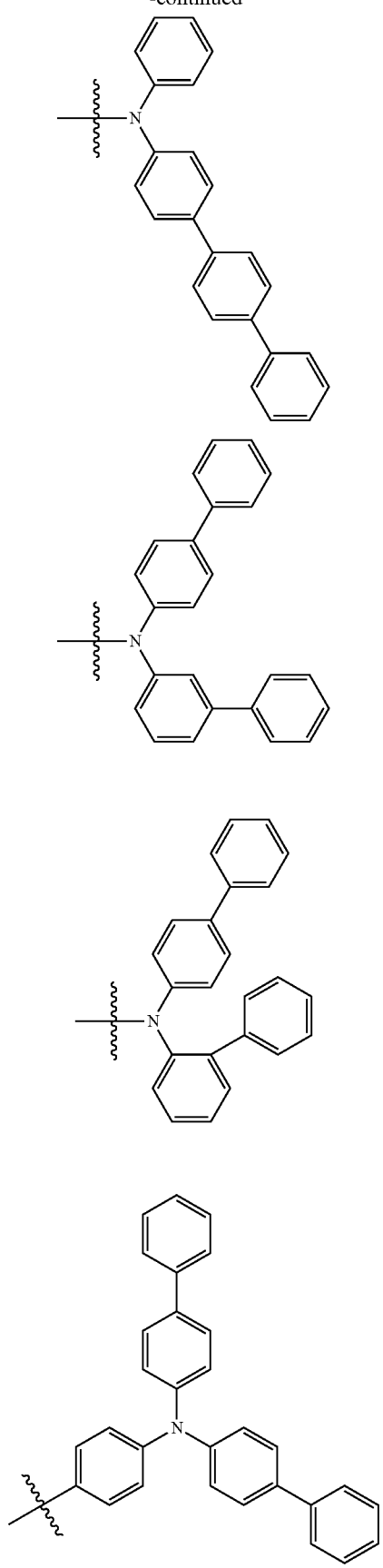
-continued
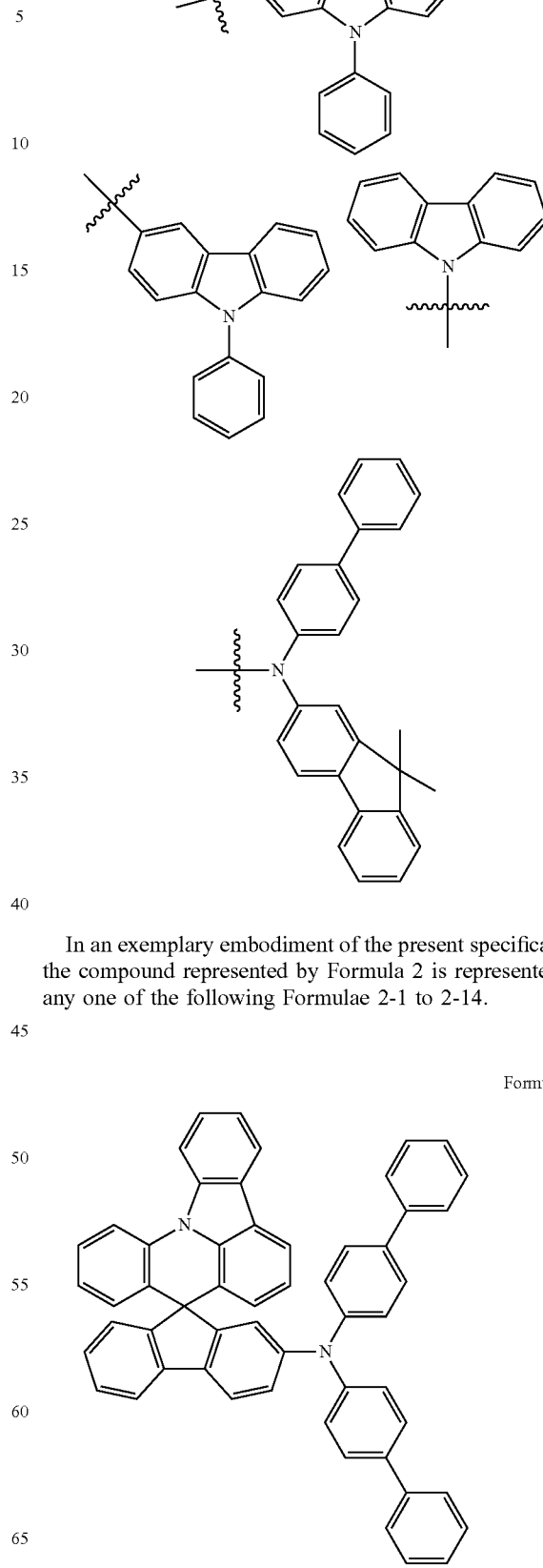
In an exemplary embodiment of the present specification, the compound represented by Formula 2 is represented by any one of the following Formulae 2-1 to 2-14.
Formula 2-1
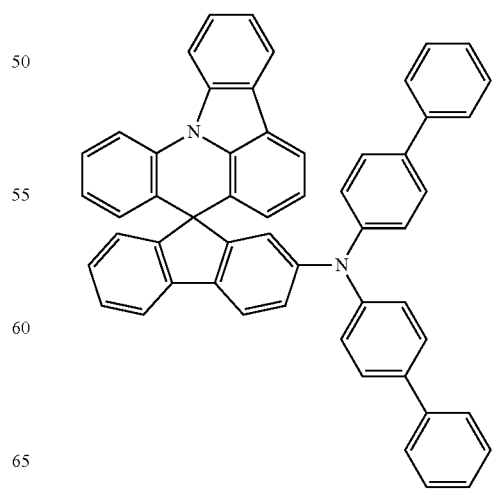

Formula 2-2
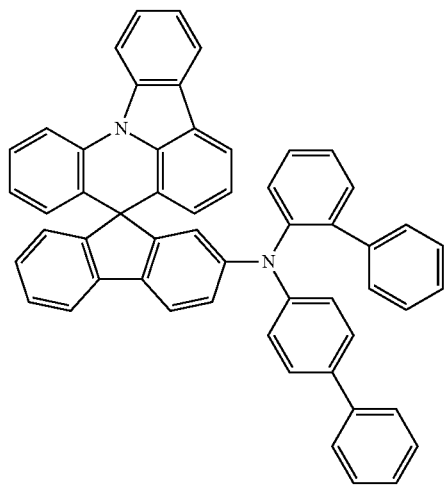
Formula 2-3
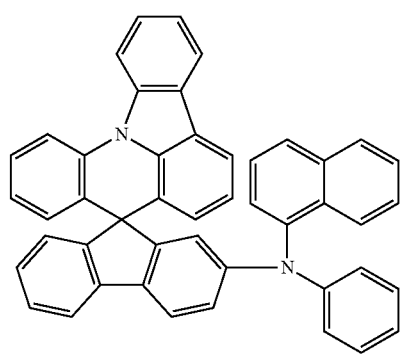
Formula 2-4
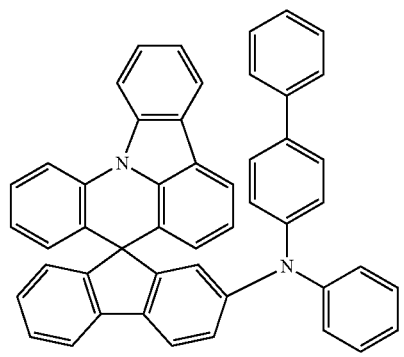
Formula 2-5
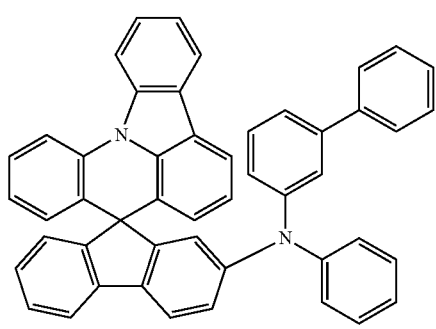
Formula 2-6
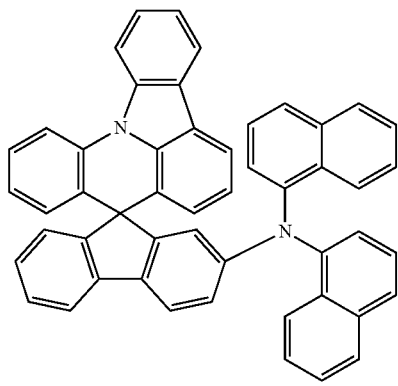
Formula 2-7
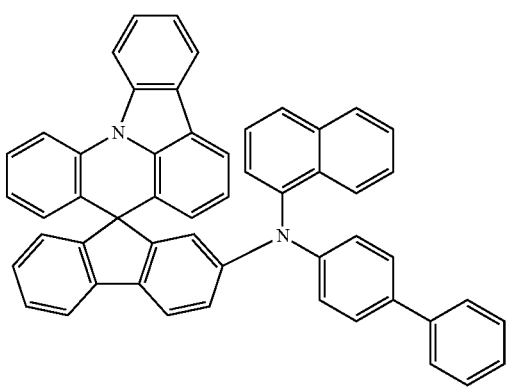
Formula 2-8
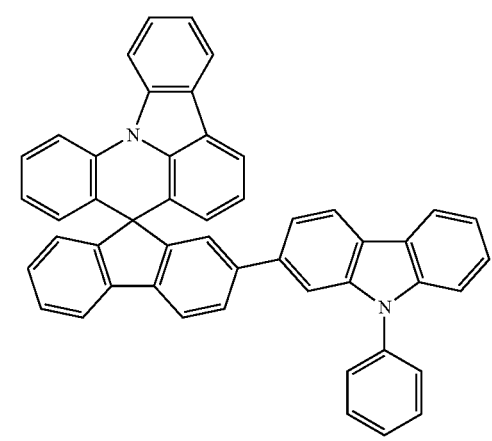
Formula 2-9
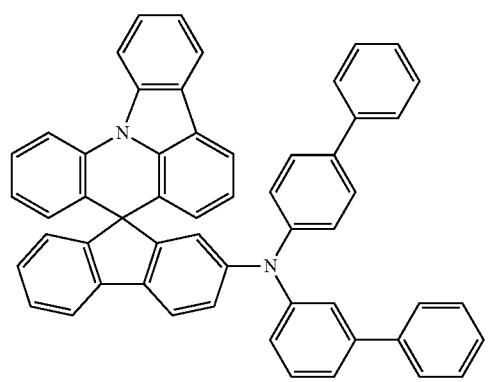

Formula 2-10

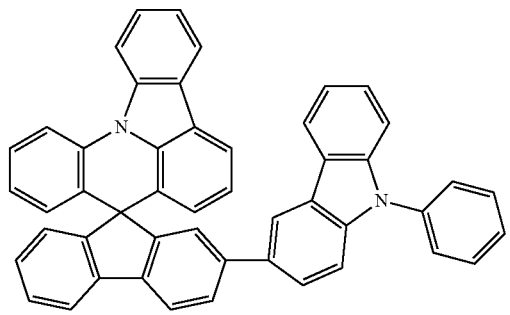

Formula 2-11

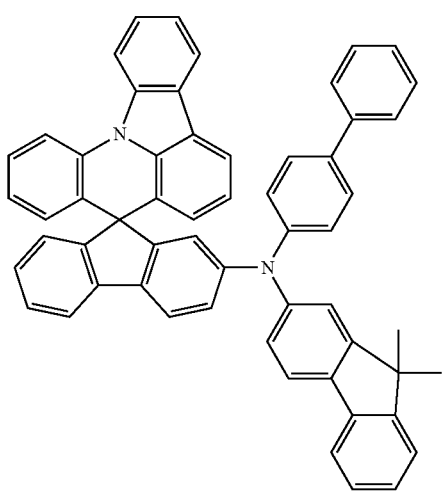

Formula 2-12

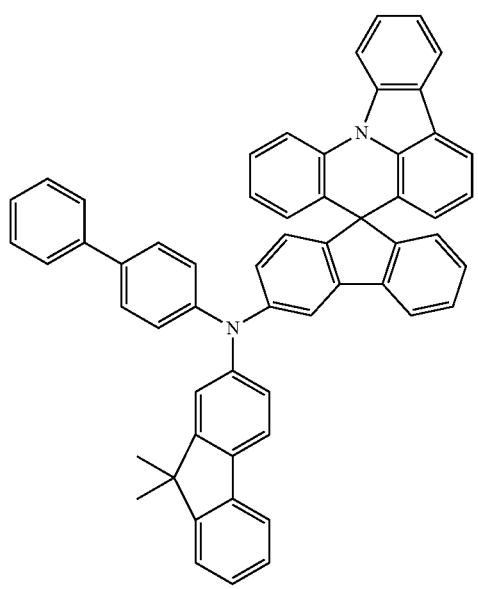

Formula 2-13

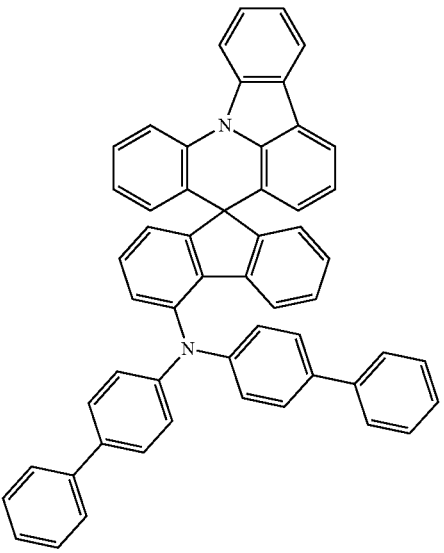

Formula 2-14

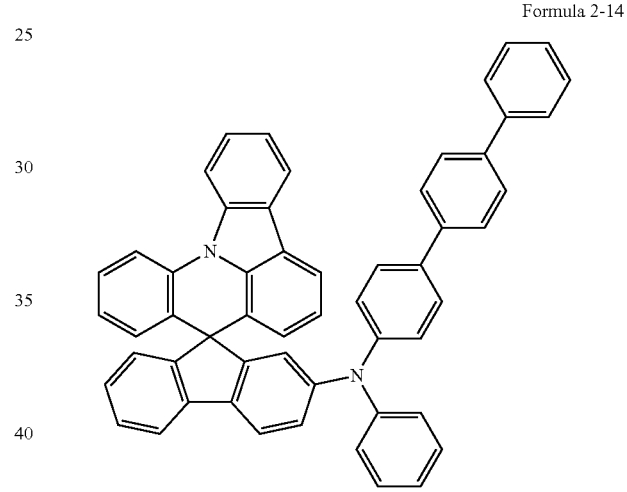

In an exemplary embodiment of the present specification, the light emitting layer including the carbazole derivative is provided to be in contact with the hole transporting layer including the spiro compound represented by Formula 2. When the light emitting layer is not in contact with the hole transporting material, the amount of holes injected from the hole transporting layer to the light emitting layer is not adjusted, so that the above-described effects may not be expected.

In an exemplary embodiment of the present specification, the light emitting layer includes only the carbazole derivative represented by Formula 1 as a host.

In an exemplary embodiment of the present specification, the hole transporting layer may further include hole transporting materials other than the hole transporting material represented by Formula 2.

The organic light emitting diode of the present specification may be manufactured by materials and methods known in the art, except that the carbazole derivative represented by Formula 1 is included in the light emitting layer, and the hole transporting material represented by Formula 2 is included in the hole transporting layer.

For example, the organic light emitting diode of the present specification may be manufactured by sequentially stacking an anode, an organic material layer, and a cathode on a substrate. In this case, the organic light emitting diode may be manufactured by depositing a metal or a metal oxide having conductivity, or an alloy thereof on a substrate to form an anode by using a physical vapor deposition (PVD) method such as sputtering or e-beam evaporation, forming an organic material layer including a hole injection layer, a hole transporting layer, a light emitting layer, and an electron transporting layer thereon, and then depositing a material, which may be used as a cathode, thereon. In addition to the method described above, an organic light emitting diode may be made by subsequently depositing a cathode material, an organic material layer, and an anode material on a substrate.

Further, the compounds represented by Formulae 1 and 2 may be formed as an organic material layer by not only a vacuum deposition method, but also a solution application method when an organic light emitting diode is manufactured. Here, the solution application method means spin coating, dip coating, doctor blading, inkjet printing, screen printing, a spray method, roll coating, and the like, but is not limited thereto.

The organic material layer of the organic light emitting diode of the present specification may be composed of a multi-layered structure in which two or more organic material layers are stacked.

In an exemplary embodiment of the present specification, the organic light emitting diode may further include one or two or more layers selected from the group consisting of a hole injection layer, a hole transporting layer, an electron transporting layer, an electron injection layer, an electron adjusting layer, an electron blocking layer, and a hole blocking layer.

For example, the structure of the organic light emitting diode of the present specification may have a structure as illustrated in FIG. 1, but is not limited thereto.

FIG. 1 illustrates the structure of an organic light emitting diode in which an anode 101, a hole injection layer 201, a hole transporting layer 501, a light emitting layer 301, an electron transporting layer 601, an electron injection layer 401, and a cathode 701 are sequentially stacked.

When the organic light emitting diode includes a plurality of organic material layers, the organic material layer may be formed of the same material or different materials.

As the anode material, a material having a large work function is usually preferred so as to smoothly inject holes into an organic material layer. Specific examples of the positive electrode material which may be used in the present invention include: a metal, such as vanadium, chromium, copper, zinc, and gold, or alloys thereof; a metal oxide, such as zinc oxide, indium oxide, indium tin oxide (ITO), and indium zinc oxide (IZO); a combination of metal and oxide, such as ZnO:Al or $SnO_2$:Sb; an electrically conductive polymer, such as poly(3-methylthiophene), poly[3,4-(ethylene-1,2-dioxy)thiophene] (PEDOT), polypyrrole, and polyaniline, and the like, but are not limited thereto.

As the cathode material, a material having a small work function is usually preferred so as to smoothly inject electrons into an organic material layer. Specific examples of the negative electrode material include: a metal, such as magnesium, calcium, sodium, potassium, titanium, indium, yttrium, lithium, gadolinium, aluminum, silver, tin, and lead, or alloys thereof; a multi-layered structural material, such as LiF/Al or $LiO_2$/Al, and the like, but are not limited thereto.

The hole injection material is a layer which injects holes from an electrode, and is preferably a compound which has a capability of transporting holes, and thus has an effect of injecting holes at a positive electrode and an excellent effect of injecting holes for the light emitting layer or the light emitting material, prevents excitons produced from the light emitting layer from moving to an electron injection layer or an electron injection material, and is excellent in forming a thin film. It is preferred that the highest occupied molecular orbital (HOMO) of the hole injection material is between the work function of the positive electrode material and the HOMO of a peripheral organic material layer. Specific examples of the hole injection material include metal porphyrin, oligothiophene, an arylamine-based organic material, a hexanitrile hexaazatriphenylene-based organic material, a quinacridone-based organic material, a perylene-based organic material, anthraquinone, a polyaniline and polythiophene-based electrically conductive polymer, and the like, but are not limited thereto.

The hole transporting layer is a layer which receives holes from the hole injection layer and transports holes to the light emitting layer, and a hole transporting material is suitably a material which may receive holes from a positive electrode or a hole injection layer to transfer holes to a light emitting layer, and has a large mobility for the holes. Specific examples thereof include an arylamine-based organic material, an electrically conductive polymer, a block copolymer in which a conjugate portion and a non-conjugate portion are present together, and the like, but are not limited thereto.

The light emitting material is a material which may receive holes and electrons from the hole transporting layer and the electron transporting layer, respectively, and combine the holes and the electrons to emit light in a visible ray region, and is preferably a material having good quantum efficiency to fluorescence or phosphorescence. Specific examples thereof include: a 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene (PPV)-based polymer; a spiro compound; polyfluorene, lubrene, and the like, but are not limited thereto.

The light emitting layer may include a host material and a dopant material. Examples of the host material include a condensed aromatic ring derivative, or a hetero ring-containing compound, and the like. Specifically, examples of the condensed aromatic ring derivative include an anthracene derivative, a pyrene derivative, a naphthalene derivative, a pentacene derivative, a phenanthrene compound, a fluoranthene compound, and the like, and examples of the hetero ring-containing compound include a carbazole derivative, a dibenzofuran derivative, a ladder-type furan compound, a pyrimidine derivative, and the like, but the examples thereof are not limited thereto.

Examples of the dopant material include an organic compound, a metal, or a metal compound.

Examples of the organic compound as the dopant material include an aromatic amine derivative, a styrylamine compound, a boron complex, a fluoranthene compound, and the like. Specifically, the aromatic amine derivative is a condensed aromatic ring derivative having a substituted or unsubstituted arylamino group, and examples thereof include a pyrene, an anthracene, a chrysene, a periflanthene, and the like having an arylamino group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group are substituted or unsubstituted. Specific examples thereof include styrylamine, styryldiamine, styryltriamine, styryletramine, and the like, but are not limited thereto. In addition, as the metal or the metal compound, a typical metal or metal compound may be used, and specifically, a metal complex may be used. Examples of the metal complex include an iridium complex, a platinum complex, and the like, but are not limited thereto.

The electron transporting material is a material which receives electrons from an electron injection layer and transports electrons to a light emitting layer, and an electron transporting material is a material which may inject electrons well from a negative electrode and may transfer electrons to a light emitting layer, and is suitably a material which has large mobility for the electrons. Specific examples thereof include: an Al complex of 8-hydroxyquinoline; a complex including $Alq_3$; an organic radical compound; a hydroxyflavone-metal complex, and the like, but are not limited thereto. The electron transporting layer may be used with any desired cathode material, as used according to the related art. In particular, examples of an appropriate cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and is preferably a compound which has a capability of transporting electrons, has an effect of injecting electrons from a negative electrode and an excellent effect of injecting electrons into a light emitting layer or a light emitting material, prevents excitons produced from the light emitting layer from moving to the hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone and derivatives thereof, a metal complex compound, a nitrogen-containing 5-membered derivative, and the like, but are not limited thereto.

Examples of the metal complex compound include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a positive electrode, and may be generally formed under the same conditions as those of the hole injection layer. Specific examples thereof include an oxadiazole derivative or a triazole derivative, a phenanthroline derivative, BCP, an aluminum complex, and the like, but are not limited thereto.

The electron blocking layer is a layer which blocks electrons from reaching a positive electrode, and may be generally formed under the same conditions as those of the electron injection layer. The electron blocking layer is composed of a material which has a significantly low capability of transporting electrons while having a function of transporting holes, and it is possible to improve the probability of recombining electrons and holes by blocking electrons while transporting holes.

The electron adjusting layer means a layer which serves to adjust the mobility of electrons according to the energy level of a light emitting layer in an organic light emitting diode. A material for the electron adjusting layer may include an organic compound containing an aromatic hetero ring.

In an exemplary embodiment of the present specification, it is possible to include an electron transporting layer and/or an electron adjusting layer between a cathode and a light emitting layer. Specifically, an electron transporting layer may be provided between the cathode and the light emitting layer, and an electron adjusting layer may be provided between the light emitting layer and the electron transporting layer.

The organic light emitting diode according to the present specification may be a top emission type, a bottom emission type, or a dual emission type according to the material to be used.

In addition, the organic light emitting diode according to the present specification may be a normal type in which a lower electrode is an anode and an upper electrode is a cathode, and may also be an inverted type in which a lower electrode is a cathode and an upper electrode is an anode.

The structure according to an exemplary embodiment of the present specification may be operated by a principle which is similar to the principle applied to an organic light emitting diode, even in an organic electronic diode including an organic solar cell, an organic photoconductor, an organic transistor, and the like.

MODE FOR INVENTION

Hereinafter, the present invention will be described in more detail through the Examples. However, the following Examples are only for exemplifying the present invention, and the scope of the present invention is not intended to be limited by the Examples.

Experimental Example 1

The values obtained by measuring the LUMO energy levels of the following Formulae [cp 4] to [cp 8], 2-1, 2-10, 2-11, 2-12, 2-13, 2-14, 1-1-1, 1-1-3, 1-1-5, 1-1-6, 1-1-19, 1-1-21, 1-1-27, 1-1-31 and 1-1-42 were described in Table 1.

An ITO was deposited to have a thickness of 50 nm or more on glass, the compounds represented by Formulae [cp 4] to [cp 8], 2-1, 2-10, 2-11, 2-12, 2-13, 2-14, 1-1-1, 1-1-3, 1-1-5, 1-1-6, 1-1-19, 1-1-21, 1-1-27, 1-1-31 and 1-1-42 were vacuum deposited to have a thickness of 100 nm, and the HOMO energy levels were measured by AC-3 manufactured by Riken Keiki Co., Ltd.

For the LUMO energy level, the absorption spectrum (abs.) and photoluminescence spectrum (PL) of each of the samples prepared above were measured, and then each spectrum edge energy was calculated, the difference was taken as a bandgap (Eg), and the LUMO energy level was calculated as a value obtained by subtracting the bandgap difference from the HOMO energy level measured from the AC-3.

TABLE 1

| Layer | Formula | LUMO energy level (eV) |
|---|---|---|
| Hole transporting layer | cp 4 | 2.61 |
| | cp 5 | 2.64 |
| | cp 6 | 2.85 |
| | cp 7 | 2.81 |
| | Formula 2-1 | 2.34 |
| | Formula 2-10 | 2.31 |
| | Formula 2-11 | 2.27 |
| | Formula 2-12 | 2.29 |
| | Formula 2-13 | 2.42 |
| | Formula 2-14 | 2.4 |
| Light emitting layer | cp 8 | 2.25 |
| | Formula 1-1-1 | 2.96 |
| | Formula 1-1-3 | 2.93 |
| | Formula 1-1-5 | 2.84 |
| | Formula 1-1-6 | 2.82 |
| | Formula 1-1-19 | 2.85 |
| | Formula 1-1-21 | 2.85 |
| | Formula 1-1-27 | 2.87 |
| | Formula 1-1-31 | 2.85 |
| | Formula 1-1-42 | 2.86 |

Example 1

A glass substrate thinly coated with indium tin oxide (ITO) to have a thickness of 500 Å was put into distilled water in which a detergent was dissolved, and ultrasonically washed. In this case, a product manufactured by the Fischer Co., was used as the detergent, and distilled water twice filtered using a filter manufactured by Millipore Co., was used as the distilled water. After the ITO was washed for 30 minutes, ultrasonic washing was conducted twice using distilled water for 10 minutes. After the washing using distilled water was completed, ultrasonic washing was conducted using isopropyl alcohol, acetone, and methanol solvents, and drying was conducted, and then the product was transferred to a plasma washing machine. In addition, the substrate was washed using oxygen plasma for 5 minutes, and then transported to a vacuum evaporator.

Hexanitrile hexaazatriphenylene of the following Formula [cp 1] was thermally vacuum deposited to have a thickness of 5 nm on the transparent ITO electrode thus prepared, thereby forming a hole injection layer.

A hole transporting layer was formed by depositing Formula 2-1 to have a thickness of 5 nm on the hole injection layer.

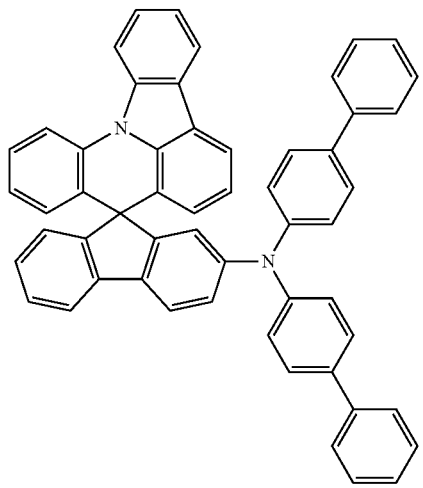

[Formula 2-1]

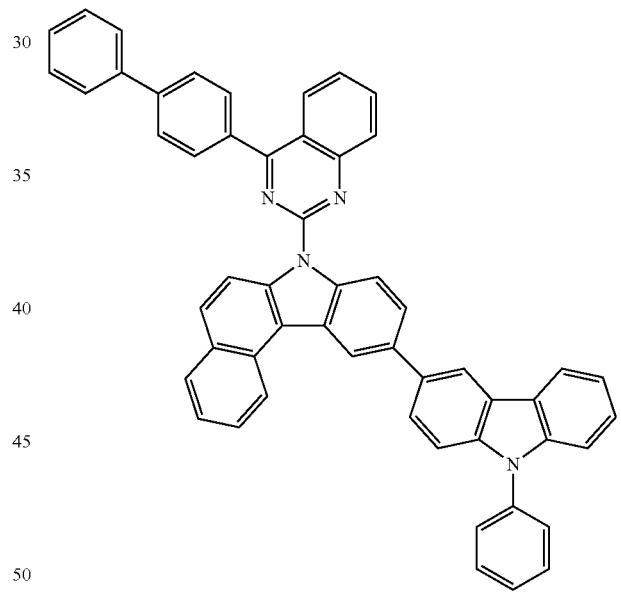

[Formula 1-1-1]

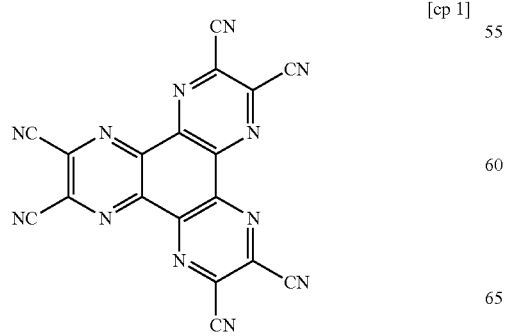

[cp 1]

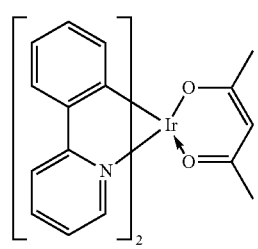

[cp 2]

-continued

[cp 3]

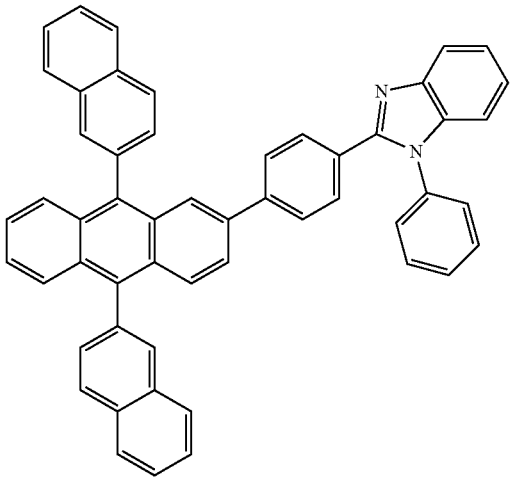

The dopant compound [cp 2] was used to have a dopant concentration of 5 wt % in the host material of Formula 1-1-1 on the hole transporting layer, thereby forming a light emitting layer having a film thickness of 40 nm.

The compound of Formula [cp 3] (30 nm) as a material for the electron transporting layer and lithium fluoride (LiF) (1 nm) were sequentially vacuum deposited on the light emitting layer, thereby forming an electron injection and transporting layer.

Aluminum was deposited to have a thickness of 100 nm on the electron injection and transporting layer, thereby forming a cathode.

In the aforementioned procedure, the deposition rate of the organic material was maintained at 0.4 to 0.7 Å/sec, the deposition rates of lithium fluoride and aluminum of the negative electrode were maintained at 0.3 Å/sec, and at 2 Å/sec, respectively, and the degree of vacuum during the deposition was maintained at $2 \times 10^{-7}$ to $5 \times 10^{-8}$ torr, thereby manufacturing an organic light emitting diode.

Example 2

An organic light emitting diode was manufactured in the same manner as in Example 1, except that Formula 1-1-3 was used instead of Formula 1-1-1 of Example 1.

Example 3

An organic light emitting diode was manufactured in the same manner as in Example 1, except that Formula 1-1-5 was used instead of Formula 1-1-1 of Example 1.

Example 4

An organic light emitting diode was manufactured in the same manner as in Example 1, except that Formula 1-1-6 was used instead of Formula 1-1-1 of Example 1, and Formula 2-11 was used instead of Formula 2-1.

Example 5

An organic light emitting diode was manufactured in the same manner as in Example 1, except that Formula 1-1-6 was used instead of Formula 1-1-1 of Example 1, and Formula 2-12 was used instead of Formula 2-1.

Example 6

An organic light emitting diode was manufactured in the same manner as in Example 1, except that Formula 1-1-19 was used instead of Formula 1-1-1 of Example 1.

Example 7

An organic light emitting diode was manufactured in the same manner as in Example 1, except that Formula 1-1-21 was used instead of Formula 1-1-1 of Example 1.

Example 8

An organic light emitting diode was manufactured in the same manner as in Example 1, except that Formula 1-1-27 was used instead of Formula 1-1-1 of Example 1.

Example 9

An organic light emitting diode was manufactured in the same manner as in Example 1, except that Formula 1-1-31 was used instead of Formula 1-1-1 of Example 1.

Example 10

An organic light emitting diode was manufactured in the same manner as in Example 1, except that Formula 2-10 was used instead of Formula 2-1 of Example 1.

Example 11

An organic light emitting diode was manufactured in the same manner as in Example 1, except that Formula 1-1-3 was used instead of Formula 1-1-1 of Example 1, and Formula 2-10 was used instead of Formula 2-1.

Example 12

An organic light emitting diode was manufactured in the same manner as in Example 1, except that Formula 1-1-5 was used instead of Formula 1-1-1 of Example 1, and Formula 2-10 was used instead of Formula 2-1.

Example 13

An organic light emitting diode was manufactured in the same manner as in Example 1, except that Formula 1-1-19 was used instead of Formula 1-1-1 of Example 1, and Formula 2-10 was used instead of Formula 2-1.

Example 14

An organic light emitting diode was manufactured in the same manner as in Example 1, except that Formula 1-1-21 was used instead of Formula 1-1-1 of Example 1, and Formula 2-10 was used instead of Formula 2-1.

Example 15

An organic light emitting diode was manufactured in the same manner as in Example 1, except that Formula 1-1-27 was used instead of Formula 1-1-1 of Example 1, and Formula 2-10 was used instead of Formula 2-1.

Example 16

An organic light emitting diode was manufactured in the same manner as in Example 1, except that Formula 1-1-31 was used instead of Formula 1-1-1 of Example 1, and Formula 2-10 was used instead of Formula 2-1.

Example 17

An organic light emitting diode was manufactured in the same manner as in Example 1, except that Formula 1-1-42 was used instead of Formula 1-1-1 of Example 1.

[cp 4]

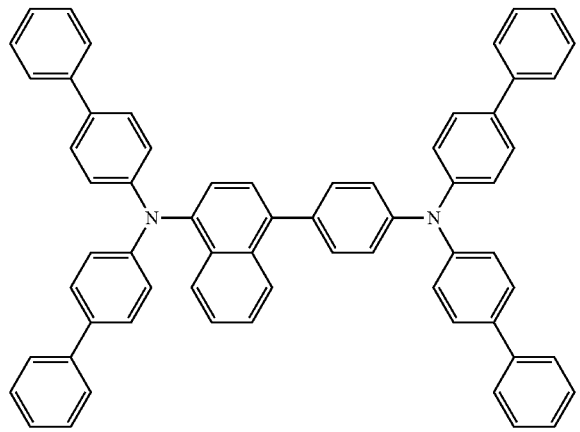

[cp 5]

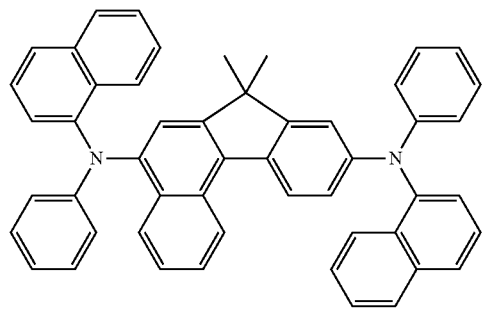

[cp 6]

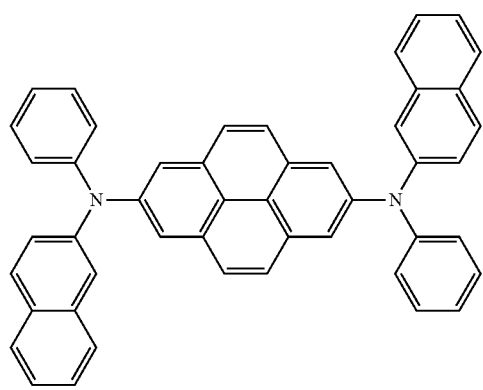

[cp 7]

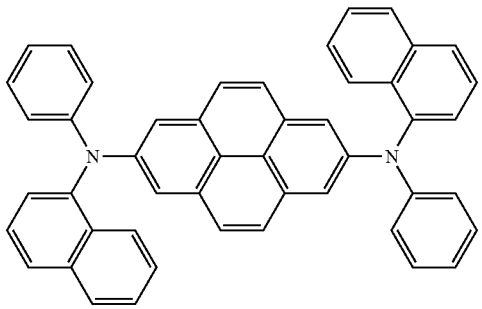

[cp 8]

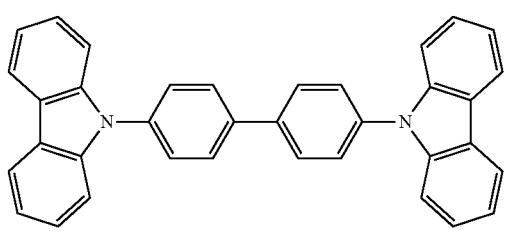

Comparative Example 1

An organic light emitting diode was manufactured in the same manner as in Example 1, except that Formula [cp 4] was used instead of Formula 2-1 of Example 1, and Formula [cp 8] was used instead of Formula 1-1-1.

Comparative Example 2

An organic light emitting diode was manufactured in the same manner as in Example 1, except that Formula [cp 5] was used instead of Formula 2-1 of Example 1, and Formula [cp 8] was used instead of Formula 1-1-1.

Comparative Example 3

An organic light emitting diode was manufactured in the same manner as in Example 1, except that Formula [cp 6] was used instead of Formula 2-1 of Example 1, and Formula [cp 8] was used instead of Formula 1-1-1.

Comparative Example 4

An organic light emitting diode was manufactured in the same manner as in Example 1, except that Formula [cp 7] was used instead of Formula 2-1 of Example 1, and Formula [cp 8] was used instead of Formula 1-1-1.

Comparative Example 5

An organic light emitting diode was manufactured in the same manner as in Example 1, except that Formula [cp 4] was used instead of Formula 2-1 of Example 1.

Comparative Example 6

An organic light emitting diode was manufactured in the same manner as in Example 1, except that Formula [cp 5] was used instead of Formula 2-1 of Example 1.

Comparative Example 7

An organic light emitting diode was manufactured in the same manner as in Example 1, except that Formula [cp 6] was used instead of Formula 2-1 of Example 1.

Comparative Example 8

An organic light emitting diode was manufactured in the same manner as in Example 1, except that Formula [cp 7] was used instead of Formula 2-1 of Example 1.

Comparative Example 9

An organic light emitting diode was manufactured in the same manner as in Example 1, except that Formula [cp 4] was used instead of Formula 2-1 of Example 1, and Formula 1-1-3 was used instead of Formula 1-1-1.

Comparative Example 10

An organic light emitting diode was manufactured in the same manner as in Example 1, except that Formula [cp 5] was used instead of Formula 2-1 of Example 1, and Formula 1-1-3 was used instead of Formula 1-1-1.

Comparative Example 11

An organic light emitting diode was manufactured in the same manner as in Example 1, except that Formula [cp 6] was used instead of Formula 2-1 of Example 1, and Formula 1-1-3 was used instead of Formula 1-1-1.

Comparative Example 12

An organic light emitting diode was manufactured in the same manner as in Example 1, except that Formula [cp 7] was used instead of Formula 2-1 of Example 1, and Formula 1-1-3 was used instead of Formula 1-1-1.

Comparative Example 13

An organic light emitting diode was manufactured in the same manner as in Example 1, except that Formula [cp 4] was used instead of Formula 2-1 of Example 1, and Formula 1-1-5 was used instead of Formula 1-1-1.

Comparative Example 14

An organic light emitting diode was manufactured in the same manner as in Example 1, except that Formula [cp 5] was used instead of Formula 2-1 of Example 1, and Formula 1-1-5 was used instead of Formula 1-1-1.

Comparative Example 15

An organic light emitting diode was manufactured in the same manner as in Example 1, except that Formula [cp 6] was used instead of Formula 2-1 of Example 1, and Formula 1-1-5 was used instead of Formula 1-1-1.

Comparative Example 16

An organic light emitting diode was manufactured in the same manner as in Example 1, except that Formula [cp 7] was used instead of Formula 2-1 of Example 1, and Formula 1-1-5 was used instead of Formula 1-1-1.

Comparative Example 17

An organic light emitting diode was manufactured in the same manner as in Example 1, except that Formula [cp 4] was used instead of Formula 2-1 of Example 1, and Formula 1-1-19 was used instead of Formula 1-1-1.

Comparative Example 18

An organic light emitting diode was manufactured in the same manner as in Example 1, except that Formula [cp 5] was used instead of Formula 2-1 of Example 1, and Formula 1-1-19 was used instead of Formula 1-1-1.

Comparative Example 19

An organic light emitting diode was manufactured in the same manner as in Example 1, except that Formula [cp 6] was used instead of Formula 2-1 of Example 1, and Formula 1-1-19 was used instead of Formula 1-1-1.

Comparative Example 20

An organic light emitting diode was manufactured in the same manner as in Example 1, except that Formula [cp 7] was used instead of Formula 2-1 of Example 1, and Formula 1-1-19 was used instead of Formula 1-1-1.

Comparative Example 21

An organic light emitting diode was manufactured in the same manner as in Example 1, except that Formula [cp 4] was used instead of Formula 2-1 of Example 1, and Formula 1-1-21 was used instead of Formula 1-1-1.

Comparative Example 22

An organic light emitting diode was manufactured in the same manner as in Example 1, except that Formula [cp 5] was used instead of Formula 2-1 of Example 1, and Formula 1-1-21 was used instead of Formula 1-1-1.

Comparative Example 23

An organic light emitting diode was manufactured in the same manner as in Example 1, except that Formula [cp 6] was used instead of Formula 2-1 of Example 1, and Formula 1-1-21 was used instead of Formula 1-1-1.

Comparative Example 24

An organic light emitting diode was manufactured in the same manner as in Example 1, except that Formula [cp 7] was used instead of Formula 2-1 of Example 1, and Formula 1-1-21 was used instead of Formula 1-1-1.

Comparative Example 25

An organic light emitting diode was manufactured in the same manner as in Example 1, except that Formula [cp 4] was used instead of Formula 2-1 of Example 1, and Formula 1-1-27 was used instead of Formula 1-1-1.

Comparative Example 26

An organic light emitting diode was manufactured in the same manner as in Example 1, except that Formula [cp 5]

was used instead of Formula 2-1 of Example 1, and Formula 1-1-27 was used instead of Formula 1-1-1.

Comparative Example 27

An organic light emitting diode was manufactured in the same manner as in Example 1, except that Formula [cp 6] was used instead of Formula 2-1 of Example 1, and Formula 1-1-27 was used instead of Formula 1-1-1.

Comparative Example 28

An organic light emitting diode was manufactured in the same manner as in Example 1, except that Formula [cp 7] was used instead of Formula 2-1 of Example 1, and Formula 1-1-27 was used instead of Formula 1-1-1.

Comparative Example 29

An organic light emitting diode was manufactured in the same manner as in Example 1, except that Formula [cp 4] was used instead of Formula 2-1 of Example 1, and Formula 1-1-31 was used instead of Formula 1-1-1.

Comparative Example 30

An organic light emitting diode was manufactured in the same manner as in Example 1, except that Formula [cp 5] was used instead of Formula 2-1 of Example 1, and Formula 1-1-31 was used instead of Formula 1-1-1.

Comparative Example 31

An organic light emitting diode was manufactured in the same manner as in Example 1, except that Formula [cp 6] was used instead of Formula 2-1 of Example 1, and Formula 1-1-31 was used instead of Formula 1-1-1.

Comparative Example 32

An organic light emitting diode was manufactured in the same manner as in Example 1, except that Formula [cp 7] was used instead of Formula 2-1 of Example 1, and Formula 1-1-31 was used instead of Formula 1-1-1.

Comparative Example 33

An organic light emitting diode was manufactured in the same manner as in Example 1, except that Formula 1-1-6 was used instead of Formula 1-1-1 of Example 1, and Formula 2-13 was used instead of Formula 2-1.

Comparative Example 34

An organic light emitting diode was manufactured in the same manner as in Example 1, except that Formula 1-1-6 was used instead of Formula 1-1-1 of Example 1, and Formula 2-14 was used instead of Formula 2-1.

Experimental Example 1

When current (10 mA/cm$^2$) and current (20 mA/cm$^2$) were applied to the organic light emitting diodes manufactured in Examples 1 to 17 and Comparative Examples 1 to 34, the results of the following Table 2 were obtained.

TABLE 2

| | Hole transporting layer | Light emitting layer host | @10 mA/cm$^2$ Voltage (Vop) | @10 mA/cm$^2$ Efficiency (cd/A) | @20 mA/cm$^2$ Service life (Life time) (hr)@95% |
|---|---|---|---|---|---|
| Example 1 | Formula 2-1 | Formula 1-1-1 | 4.27 | 24.2 | 363.4 |
| Example 2 | Formula 2-1 | Formula 1-1-3 | 4.13 | 23.5 | 531.5 |
| Example 3 | Formula 2-1 | Formula 1-1-5 | 4.16 | 21.4 | 363.4 |
| Example 4 | Formula 2-11 | Formula 1-1-6 | 4.17 | 24.4 | 382.5 |
| Example 5 | Formula 2-12 | Formula 1-1-6 | 4.11 | 24 | 393.6 |
| Example 6 | Formula 2-1 | Formula 1-1-19 | 4.44 | 20.4 | 405.1 |
| Example 7 | Formula 2-1 | Formula 1-1-21 | 4.39 | 21.1 | 417.4 |
| Example 8 | Formula 2-1 | Formula 1-1-27 | 4.68 | 24.3 | 419.6 |
| Example 9 | Formula 2-1 | Formula 1-1-31 | 4.09 | 22 | 398.7 |
| Example 10 | Formula 2-10 | Formula 1-1-1 | 4.56 | 23.6 | 427.3 |
| Example 11 | Formula 2-10 | Formula 1-1-3 | 4.67 | 24.4 | 514.2 |
| Example 12 | Formula 2-10 | Formula 1-1-5 | 4.50 | 22.3 | 387.1 |
| Example 13 | Formula 2-10 | Formula 1-1-19 | 4.89 | 23.1 | 413.2 |
| Example 14 | Formula 2-10 | Formula 1-1-21 | 4.91 | 22.3 | 429.7 |
| Example 15 | Formula 2-10 | Formula 1-1-27 | 4.73 | 21.8 | 435.1 |
| Example 16 | Formula 2-10 | Formula 1-1-31 | 4.71 | 21 | 411.1 |
| Example 17 | Formula 2-1 | Formula 1-1-42 | 4.06 | 22.8 | 406.9 |
| Comparative Example 1 | cp 4 | cp 8 | 6.06 | 14.6 | 109.5 |
| Comparative Example 2 | cp 5 | | 6.01 | 14.7 | 123.4 |
| Comparative Example 3 | cp 6 | | 6 | 14.6 | 127.4 |
| Comparative Example 4 | cp 7 | | 6.03 | 14.8 | 114.8 |
| Comparative Example 5 | cp 4 | Formula 1-1-1 | 6.07 | 14.6 | 121.4 |
| Comparative Example 6 | cp 5 | | 6.03 | 14.6 | 140.0 |
| Comparative Example 7 | cp 6 | | 6.14 | 14.3 | 145.1 |
| Comparative Example 8 | cp 7 | | 6.05 | 14.4 | 134.0 |
| Comparative Example 9 | cp 4 | Formula 1-1-3 | 6.59 | 12.8 | 134.0 |
| Comparative Example 10 | cp 5 | | 6.01 | 14.1 | 190.3 |
| Comparative Example 11 | cp 6 | | 6.02 | 14.2 | 184.6 |
| Comparative Example 12 | cp 7 | | 5.97 | 14.2 | 146.3 |
| Comparative Example 13 | cp 4 | Formula 1-1-5 | 6.01 | 14.5 | 106.7 |
| Comparative Example 14 | cp 5 | | 6.18 | 11.4 | 170.1 |
| Comparative Example 15 | cp 6 | | 6.23 | 9.8 | 196.5 |
| Comparative Example 16 | cp 7 | | 6.15 | 13.7 | 165.3 |
| Comparative Example 17 | cp 4 | Formula 1-1-19 | 6.85 | 16 | 148.9 |
| Comparative Example 18 | cp 5 | | 6.31 | 15.4 | 137.9 |
| Comparative Example 19 | cp 6 | | 6.37 | 14.3 | 151.5 |
| Comparative Example 20 | cp 7 | | 6.39 | 17.1 | 144.3 |

TABLE 2-continued

| | Hole transporting layer | Light emitting layer host | @10 mA/cm² Voltage (Vop) | @10 mA/cm² Efficiency (cd/A) | @20 mA/cm² Service life (Life time) (hr)@95% |
|---|---|---|---|---|---|
| Comparative Example 21 | cp 4 | Formula 1-1-21 | 6.24 | 17.3 | 152.1 |
| Comparative Example 22 | cp 5 | | 6.2 | 16.9 | 148.8 |
| Comparative Example 23 | cp 6 | | 6.19 | 13.1 | 213.1 |
| Comparative Example 24 | cp 7 | | 6.19 | 17.1 | 197.1 |
| Comparative Example 25 | cp 4 | Formula 1-1-27 | 6.53 | 16.8 | 98.4 |
| Comparative Example 26 | cp 5 | | 6.71 | 16.8 | 132.1 |
| Comparative Example 27 | cp 6 | | 6.93 | 17.3 | 199.4 |
| Comparative Example 28 | cp 7 | | 6.74 | 16.2 | 188.3 |
| Comparative Example 29 | cp 4 | Formula 1-1-31 | 5.95 | 14.3 | 104.3 |
| Comparative Example 30 | cp 5 | | 6.04 | 14.2 | 114.5 |
| Comparative Example 31 | cp 6 | | 6.31 | 13.1 | 109.4 |
| Comparative Example 32 | cp 7 | | 5.91 | 16 | 108.8 |
| Comparative Example 33 | Formula 2-13 | Formula 1-1-6 | 6.45 | 22.4 | 120.4 |
| Comparative Example 34 | Formula 2-14 | Formula 1-1-6 | 5.83 | 21.8 | 265.7 |

From the result of Table 2, it can be confirmed that the organic light emitting diode according to an exemplary embodiment of the present specification exhibits excellent characteristics in efficiency, driving voltage, and stability. Specifically, the organic light emitting diode according to an exemplary embodiment of the present specification may improve the power consumption by reducing the driving voltage and inducing an increase in efficiency.

Specifically, it can be confirmed that the case where the carbazole derivative represented by Formula 1 is included in the light emitting layer, the spiro compound represented by Formula 2 is included in the hole transporting layer, and simultaneously, a hole transporting material having a LUMO energy level difference of 0.5 eV or more with a host material for the light emitting layer is included in the hole transporting layer as in Examples 1 to is excellent in efficiency, driving voltage, and stability compared to the case where the carbazole derivative represented by Formula 1 is included, but the spiro compound represented by Formula 2 is not included in the hole transporting layer as in Comparative Examples 5 to 32.

More specifically, it can be confirmed that the case where the carbazole derivative represented by Formula 1 is included in the light emitting layer, the spiro compound represented by Formula 2 is included in the hole transporting layer, and simultaneously, a hole transporting material having a LUMO energy level difference of 0.5 eV or more with a host material for the light emitting layer is included in the hole transporting layer as in Examples 1 to is excellent in efficiency, driving voltage, and stability compared to the case where the LUMO energy level difference of the hole transporting material with between the host material of the light emitting layer is 0.5 eV or more, but the carbazole derivative represented by Formula 1 is not included as in Comparative Examples 3 and 4.

Furthermore, in the case of Comparative Examples 33 and 34, it can be confirmed that the case where the carbazole derivative represented by Formula 1 according to an exemplary embodiment of the present specification is included in the light emitting layer, the spiro compound represented by Formula 2 according to an exemplary embodiment of the present specification is included in the hole transporting layer, but the difference in LUMO energy levels is not satisfied is adverse in efficiency, driving voltage, and stability of the organic light emitting diode compared to the case where the difference in the LUMO energy levels is 0.5 eV or more.

The invention claimed is:
1. An organic light emitting diode comprising:
   a cathode;
   an anode;
   a light emitting layer provided between the cathode and the anode; and
   a hole transporting layer provided between the anode and the light emitting layer,
   wherein the light emitting layer comprises a carbazole derivative represented by the following Formula 1,
   the hole transporting layer comprises a spiro compound represented by the following Formula 2, and
   a difference between a LUMO energy level of the carbazole derivative represented by Formula 1, which is and comprised in the light emitting layer, and a LUMO energy level of the spiro compound represented by Formula 2, which is comprised in the hole transporting layer, is 0.5 eV or more:

[Formula 1]

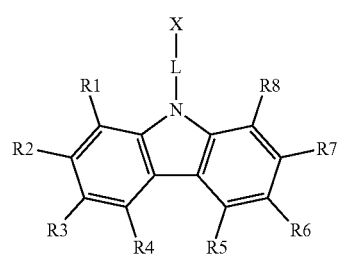

in Formula 1,
L is a direct bond; or a substituted or unsubstituted arylene group,
X is a heterocyclic group which is unsubstituted or substituted with one or two or more substituents selected from the group consisting of a heterocyclic group and an aryl group,
R3 and R4 combine with each other to form a substituted or unsubstituted aromatic ring,
a substituent of the formed aromatic ring; R1; R2; and R5 to R8 are the same as or different from each other, and are each independently hydrogen; deuterium; a substituted or unsubstituted aryl group; or a substituted or unsubstituted heterocyclic group,
at least one of a substituent of the formed aromatic ring; R1; R2; and R5 to R8 is -L1-A,
L1 is a direct bond; a substituted or unsubstituted arylene group; or a substituted or unsubstituted divalent heterocyclic group,
A is a heterocyclic group comprising one or more of substituted or unsubstituted N and S atoms,

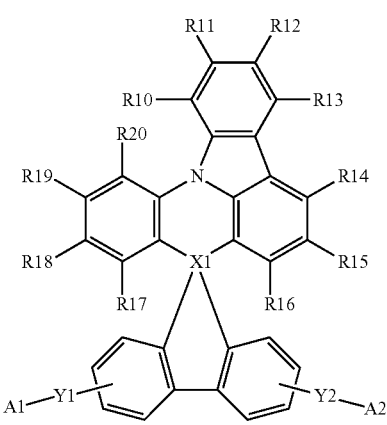

[Formula 2]

in Formula 2,

X1 is C or Si,

Y1 and Y2 are the same as or different from each other, and are each independently a direct bond; a substituted or unsubstituted arylene group; or a substituted or unsubstituted divalent heterocyclic group, A1 and A2 are the same as or different from each other, and are each independently hydrogen; a substituted or unsubstituted carbazole group; a substituted or unsubstituted benzocarbazole group; or —NZ1Z2, at least one of A1 and A2 is a substituted or unsubstituted carbazole group; a substituted or unsubstituted benzocarbazole group; or —NZ1Z2, Z1 and Z2 are the same as or different from each other, and are each independently hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group, R10 to R20 are the same as or different from each other, and are each independently hydrogen; deuterium; a halogen group; a nitrile group; a nitro group; an imide group; an amide group; an ester group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group, or R10 and R20 are capable of forming a ring with a direct bond; or a group selected from the group consisting of O, S, NR, PR, C=O, CRR', and SiRR', and R and R' are the same as or different from each other, and are each independently hydrogen; a nitrile group; a nitro group; an amide group; an ester group; a substituted or unsubstituted alkyl group; a substituted or unsubstituted alkoxy group; a substituted or unsubstituted alkenyl group; a substituted or unsubstituted aryl group; a substituted or unsubstituted arylamine group; or a substituted or unsubstituted heterocyclic group, or R and R' are capable of combining with each other to form a spiro compound.

2. The organic light emitting diode of claim 1, wherein the light emitting layer comprises: a host comprising the carbazole derivative represented by Formula 1; and a dopant.

3. The organic light emitting diode of claim 1, wherein the light emitting layer comprises: a host comprising a carbazole derivative represented by the following Formula 1-1; and a dopant:

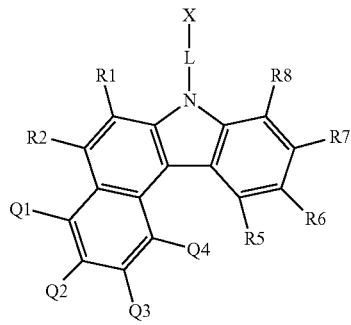

[Formula 1-1]

in Formula 1-1,

L, X, R1, R2, and R5 to R8 are the same as those defined in Formula 1,

Q1 to Q4 are the same as or different from each other, and are each independently hydrogen; deuterium; a substituted or unsubstituted aryl group; or a substituted or unsubstituted heterocyclic group, at least one of R1, R2, R5 to R8, and Q1 to Q4 is -L1-A, and L1 and A are the same as those defined in Formula 1.

4. The organic light emitting diode of claim 1, wherein L1 is a direct bond; or a substituted or unsubstituted phenylene group, and A is a substituted or unsubstituted carbazole group; a substituted or unsubstituted thiophene group; or a substituted or unsubstituted dibenzothiophene group.

5. The organic light emitting diode of claim 1, wherein L is a direct bond; or a substituted or unsubstituted phenylene group, and X is a triazine group which is unsubstituted or substituted with an aryl group; a pyrimidine group which is unsubstituted or substituted with an aryl group; or a quinazoline group which is unsubstituted or substituted with an aryl group.

6. The organic light emitting diode of claim 1, wherein the carbazole derivative represented by Formula 1 is any one of the following Formulae 1-1-1 to 1-1-50:

Formula 1-1-1
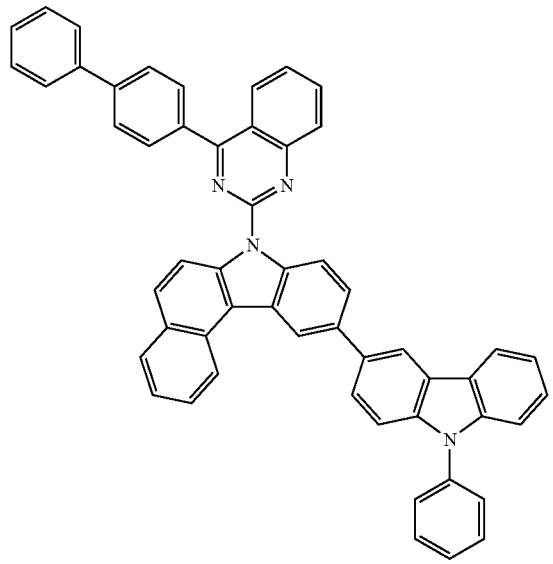
Formula 1-1-2
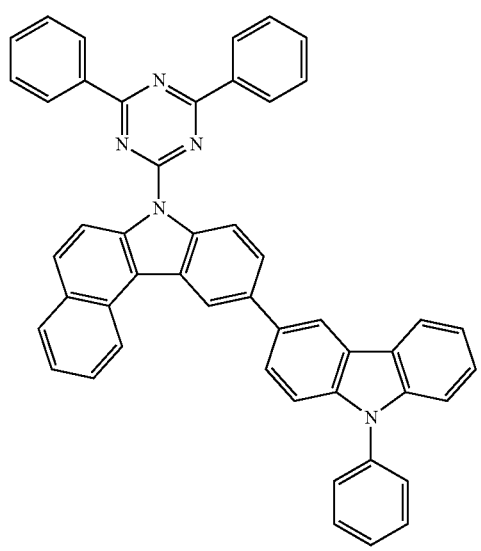
Formula 1-1-3
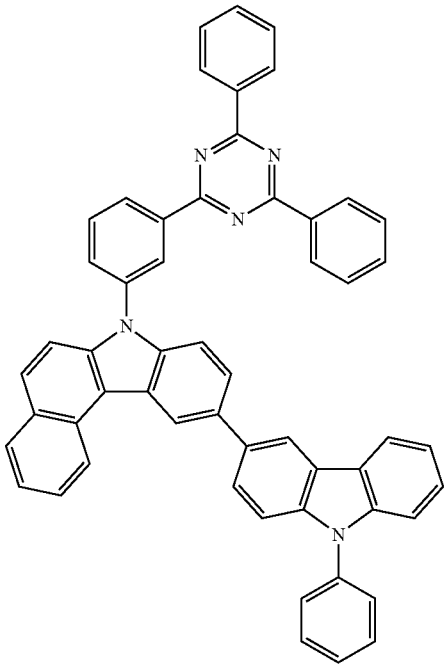
Formula 1-1-4
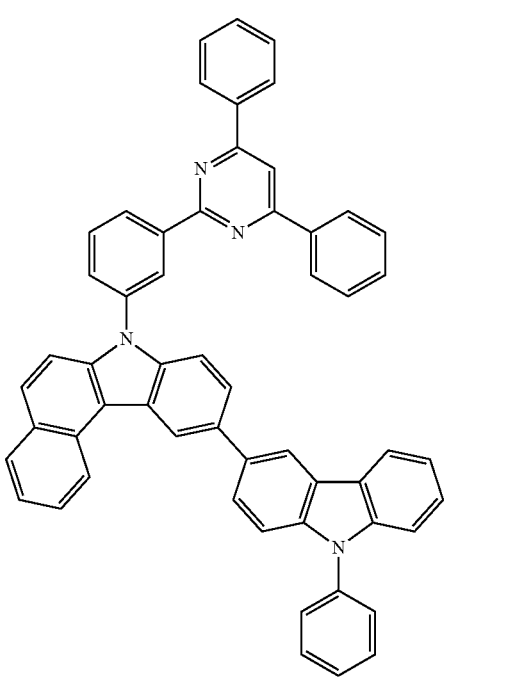

Formula 1-1-5
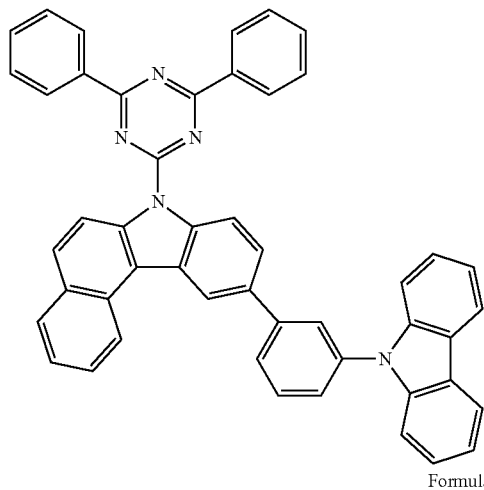
Formula 1-1-6
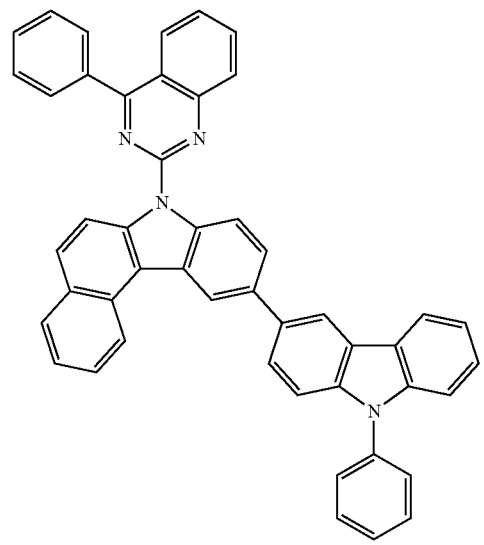
Formula 1-1-7
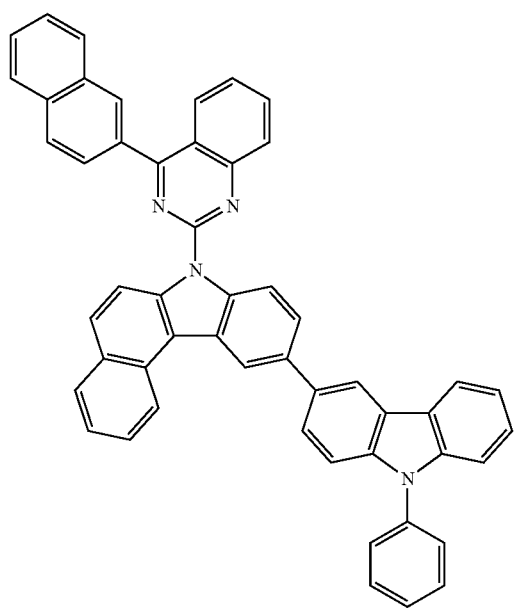
Formula 1-1-8
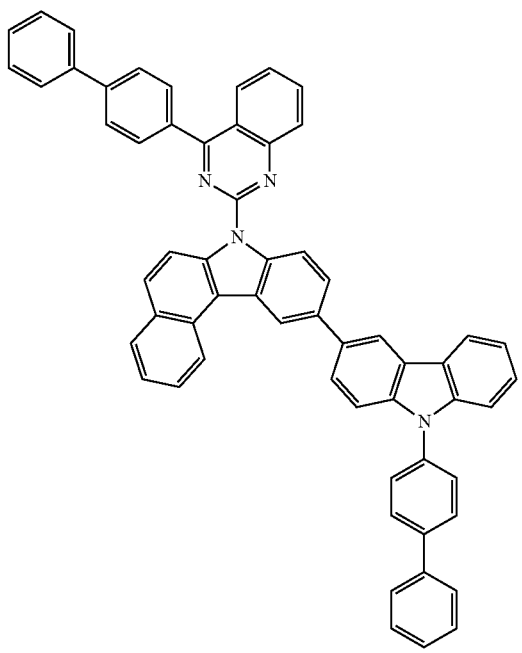
Formula 1-1-9
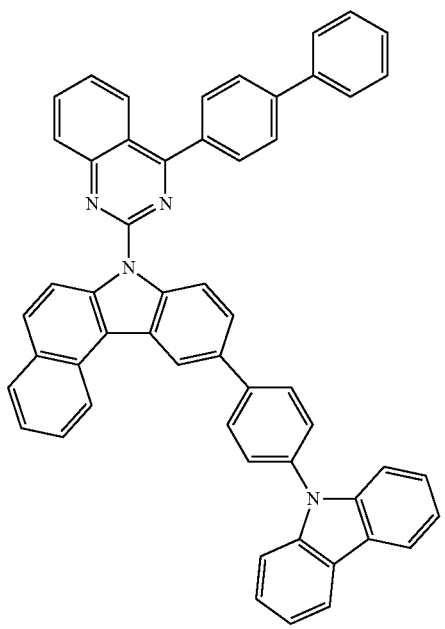

Formula 1-1-10
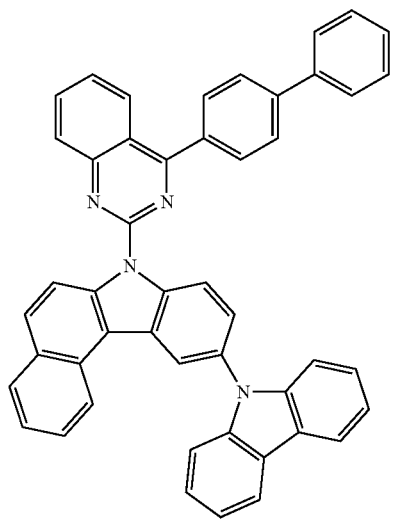
Formula 1-1-11
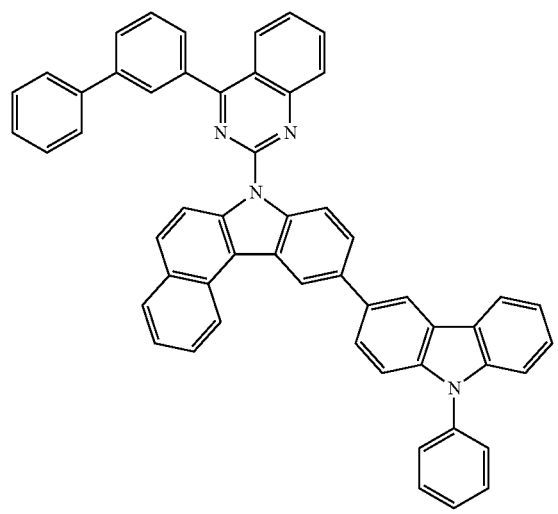
Formula 1-1-12
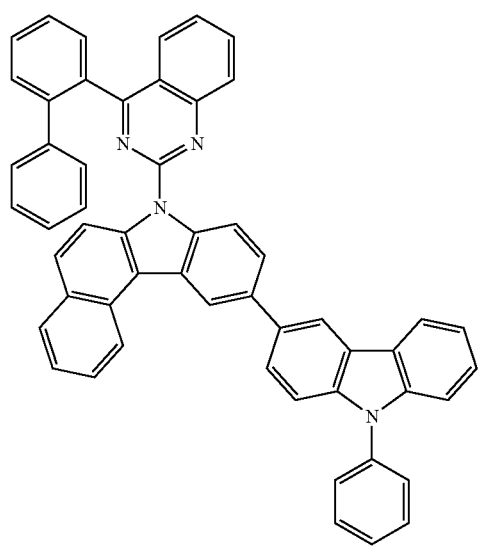
Formula 1-1-13
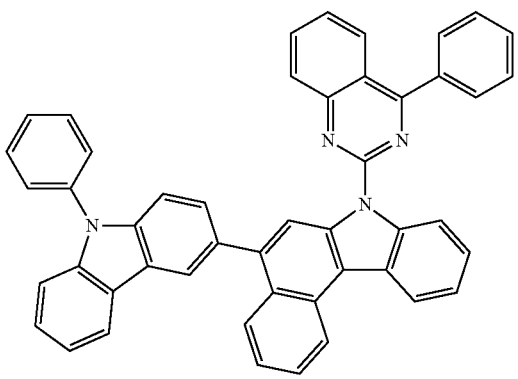
Formula 1-1-14
Formula 1-1-15
Formula 1-1-16
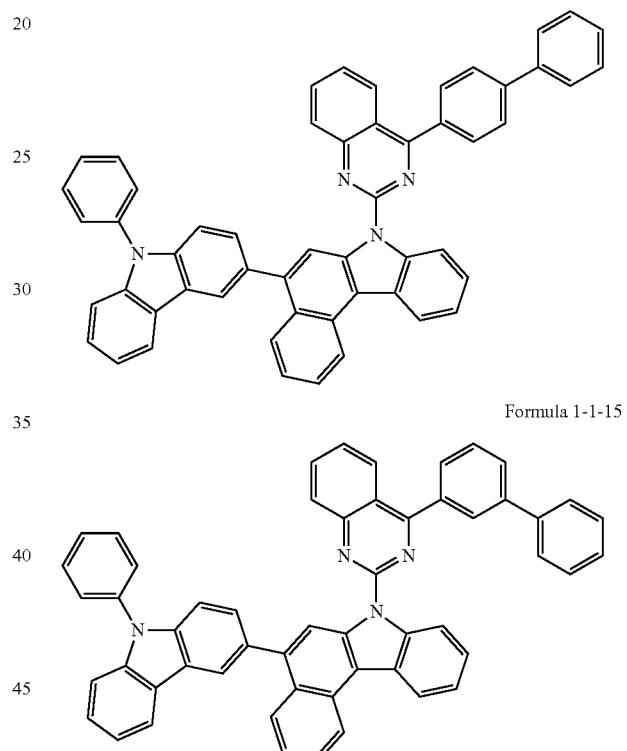
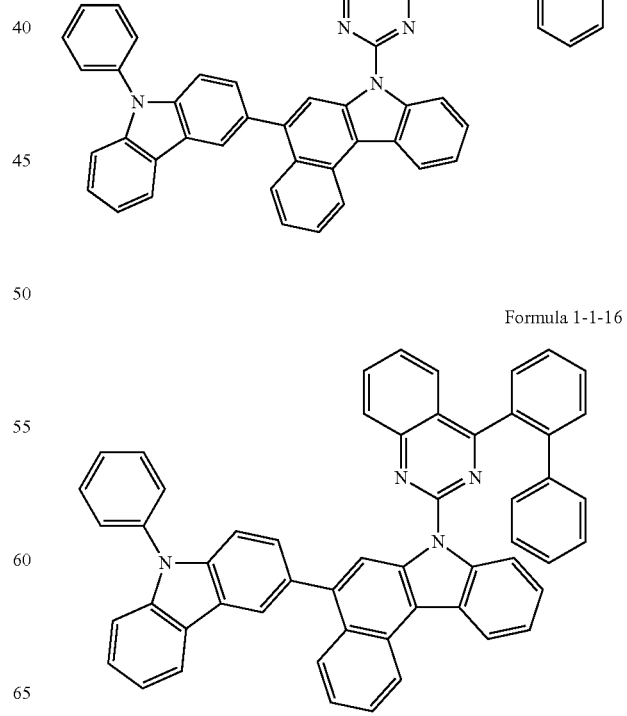

Formula 1-1-17
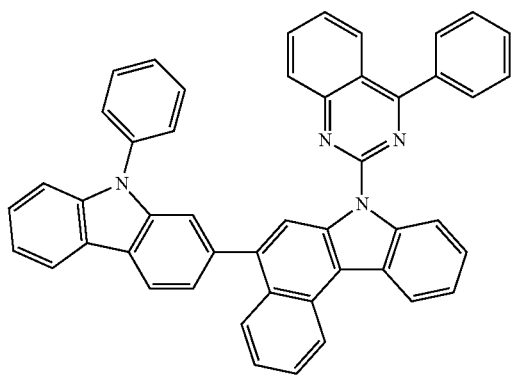
Formula 1-1-18
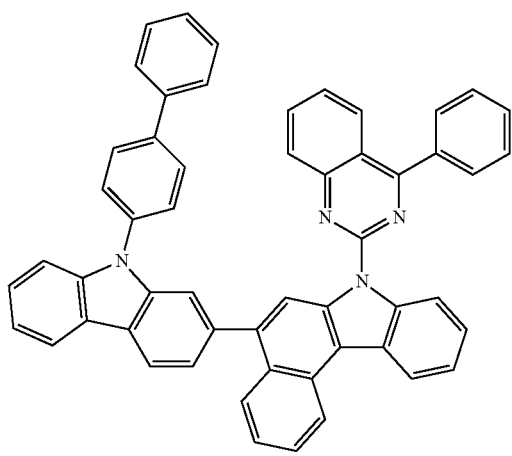
Formula 1-1-19
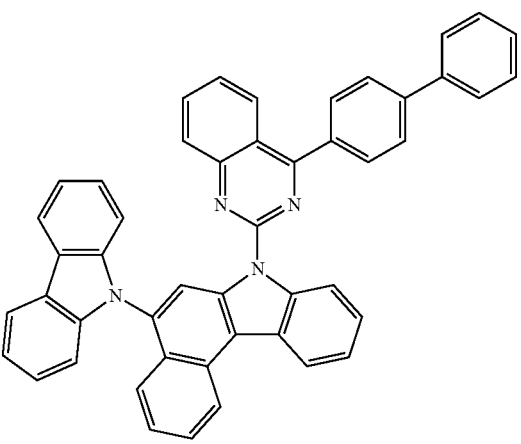
Formula 1-1-20
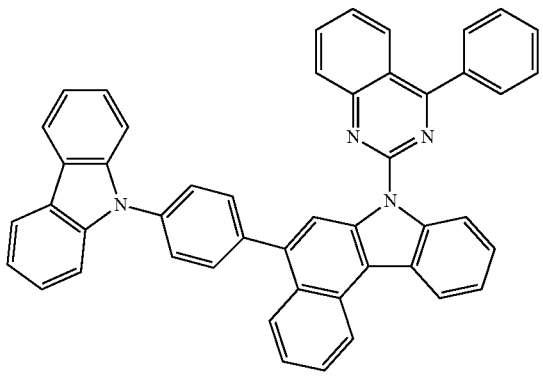
Formula 1-1-21
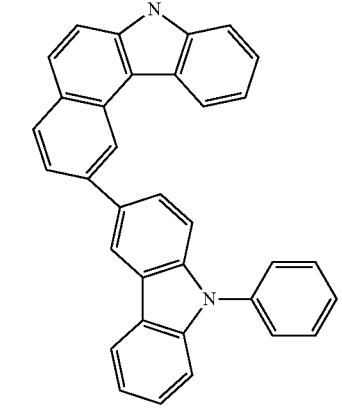
Formula 1-1-22
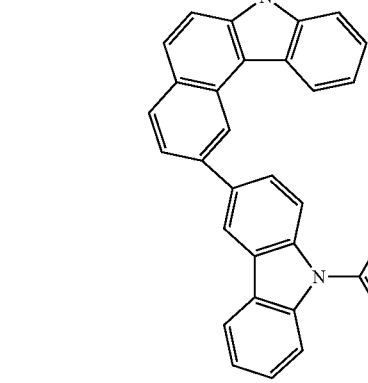

-continued
Formula 1-1-23
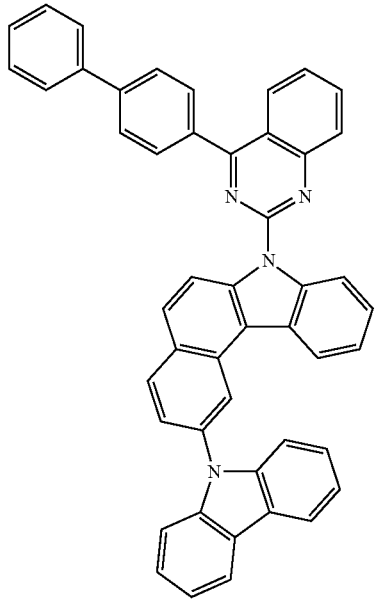
Formula 1-1-24
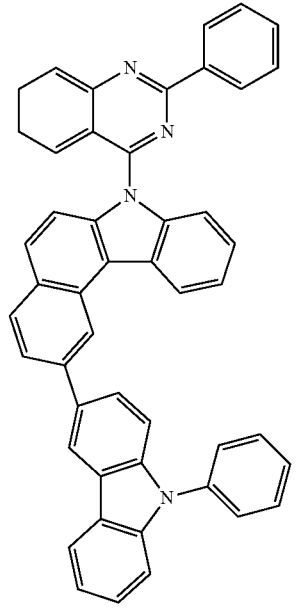
Formula 1-1-25
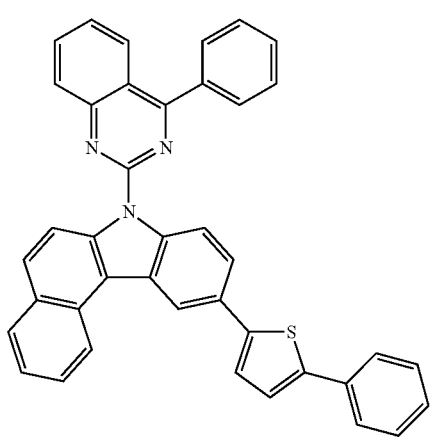
-continued
Formula 1-1-26
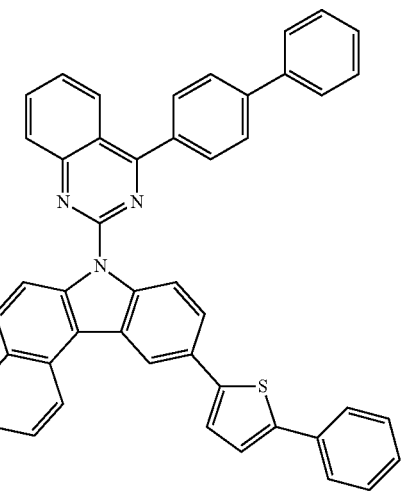
Formula 1-1-27
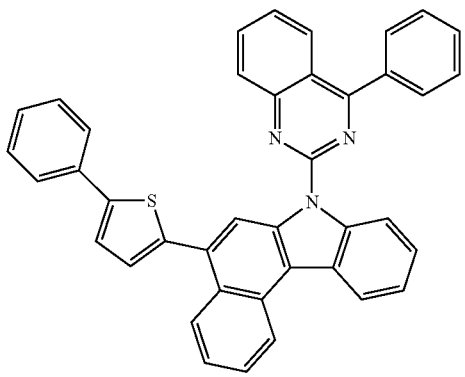
Formula 1-1-28
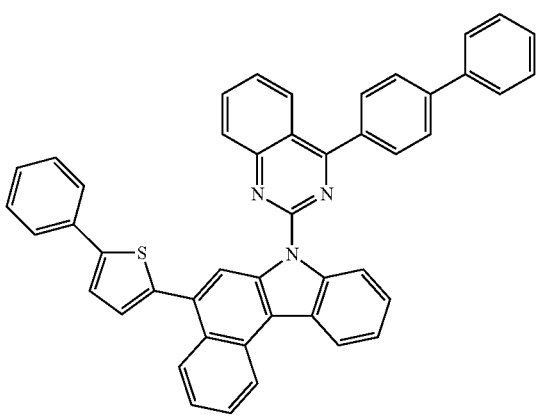

Formula 1-1-29
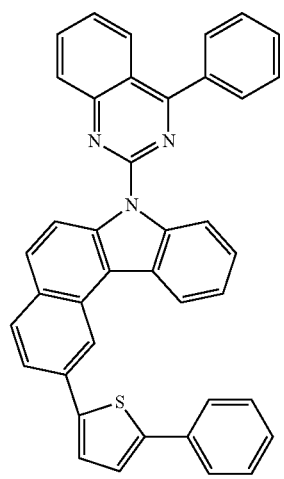
Formula 1-1-32
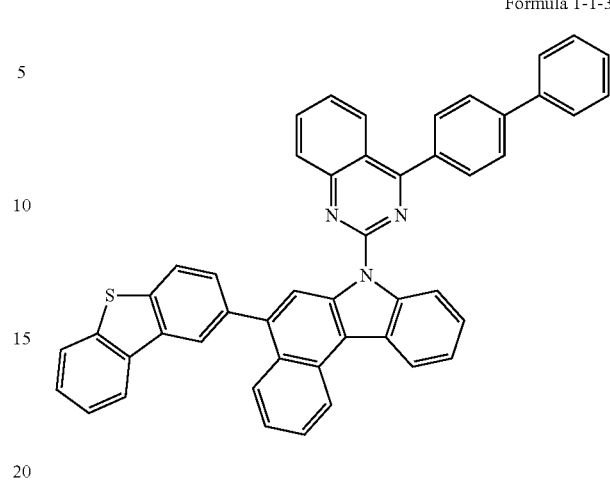
Formula 1-1-30
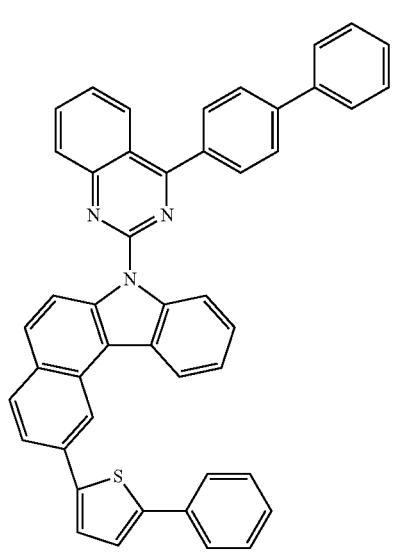
Formula 1-1-33
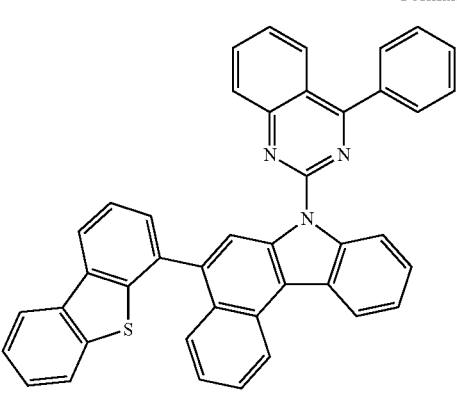
Formula 1-1-31
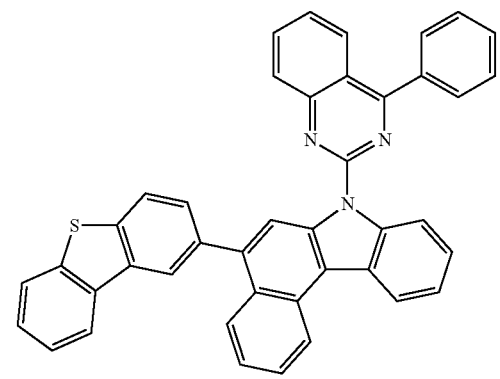
Formula 1-1-34
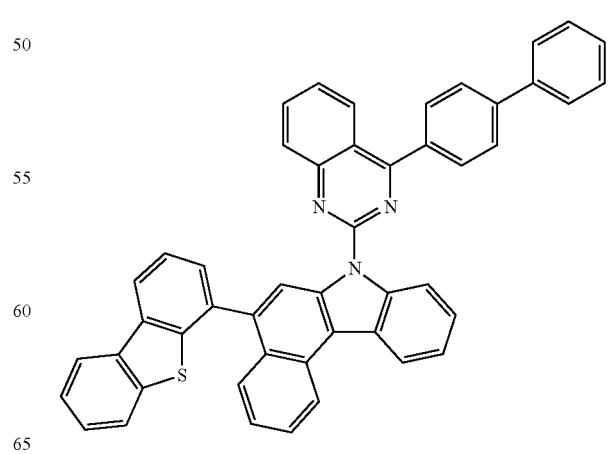

Formula 1-1-35
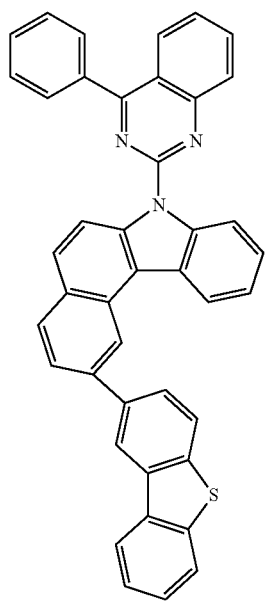
Formula 1-1-37
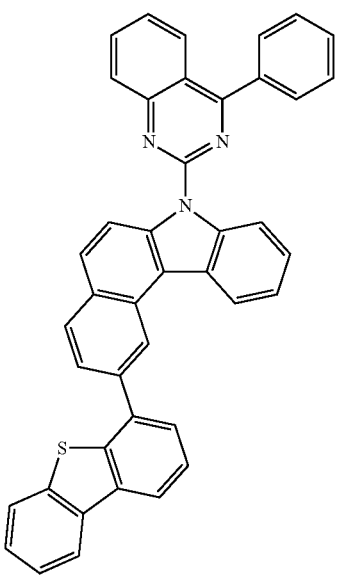
Formula 1-1-36
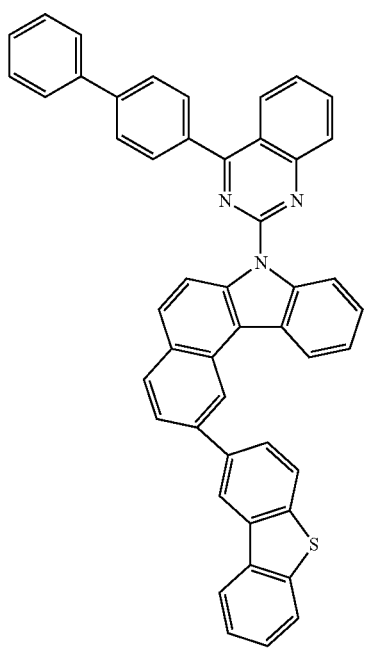
Formula 1-1-38
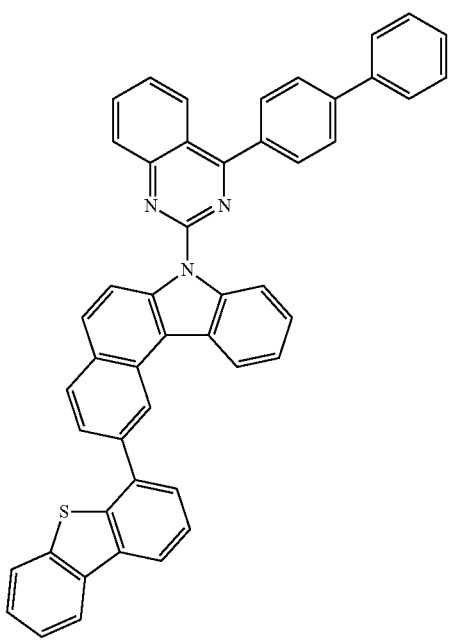

-continued
Formula 1-1-39
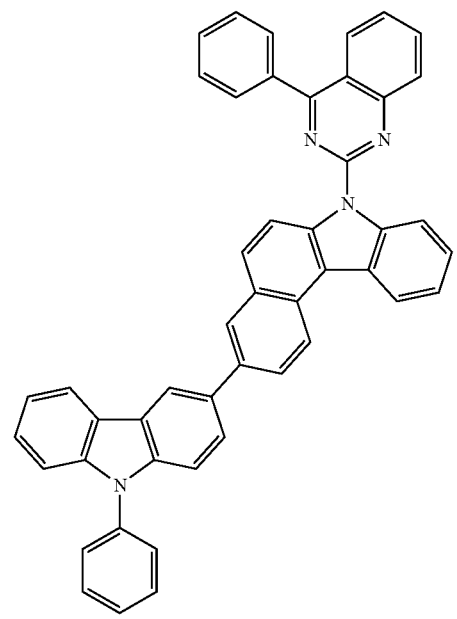
Formula 1-1-40
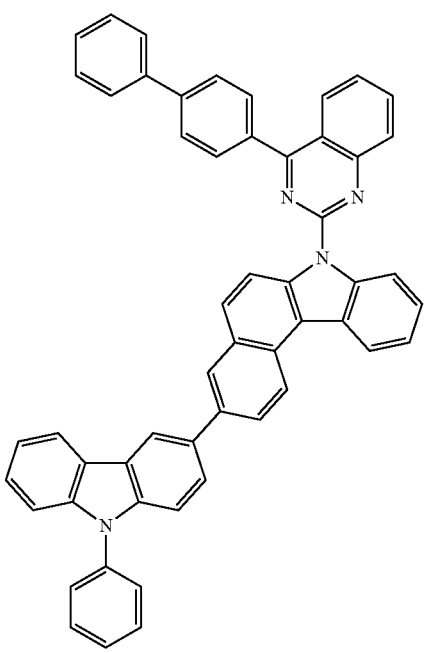
Formula 1-1-41
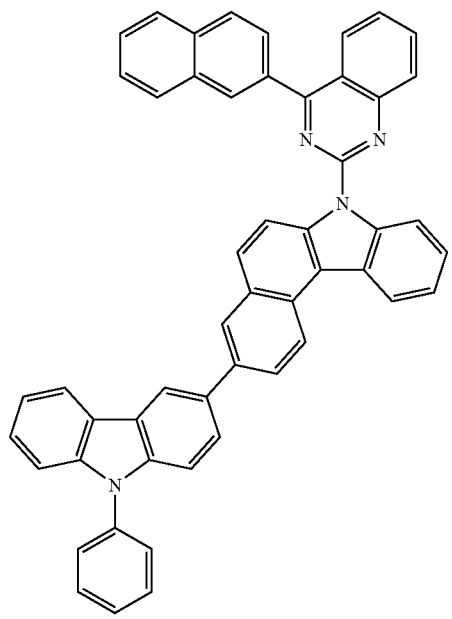
Formula 1-1-42
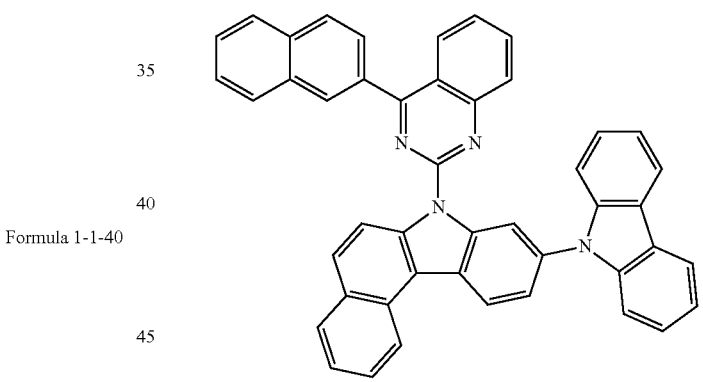
Formula 1-1-43
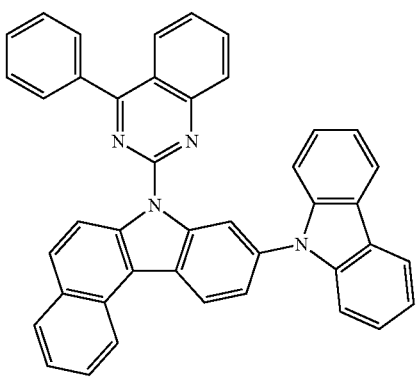

Formula 1-1-44
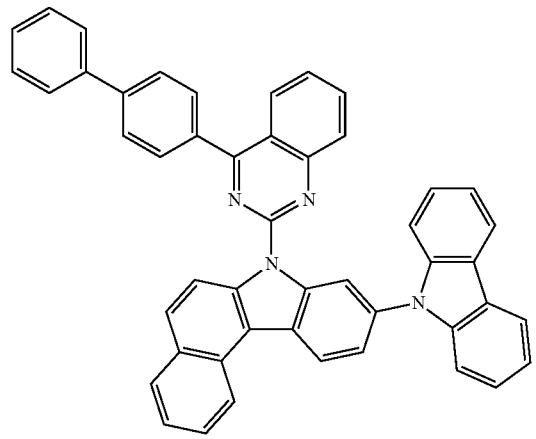
Formula 1-1-45
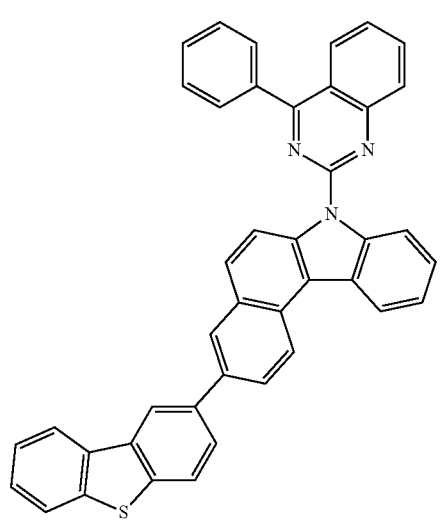
Formula 1-1-46
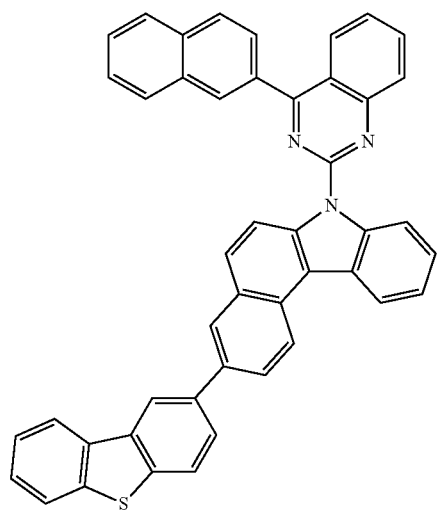
Formula 1-1-47
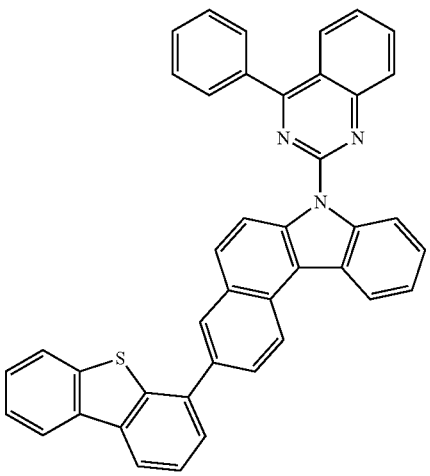
Formula 1-1-48
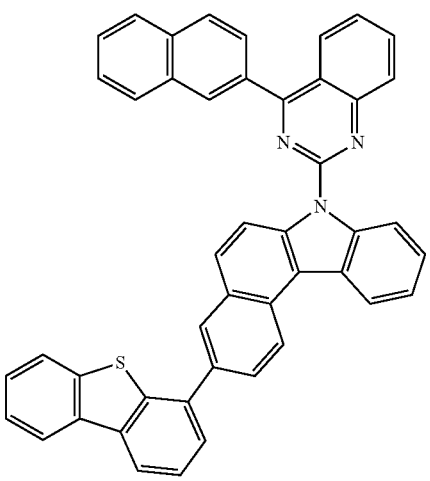
Formula 1-1-49
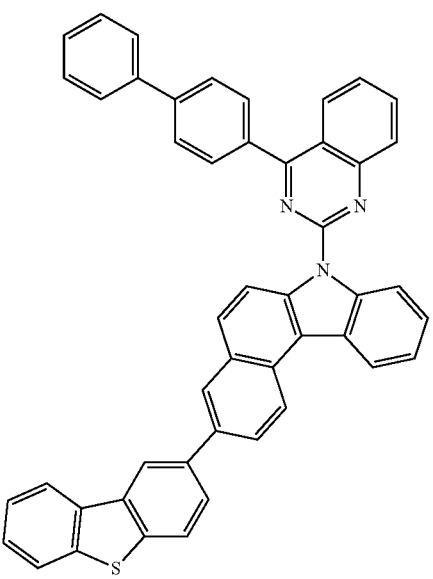

Formula 1-1-50

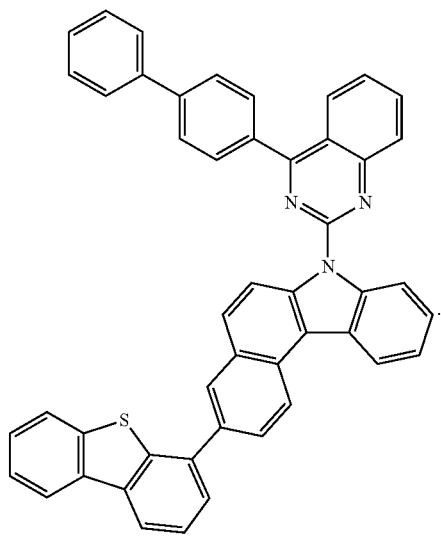

7. The organic light emitting diode of claim 1, wherein the light emitting layer comprising the carbazole derivative represented by Formula 1 is provided to be in contact with the hole transporting layer comprising the spiro compound represented by Formula 2.

8. The organic light emitting diode of claim 1, wherein the organic light emitting diode emits red phosphorescence.

9. The organic light emitting diode of claim 1, wherein at least one of A1 and A2 is a carbazole group which is unsubstituted or substituted with an aryl group; or —NZ1Z2, and Z1 and Z2 are the same as or different from each other, and are each independently a substituted or unsubstituted aryl group.

10. The organic light emitting diode of claim 1, wherein the compound represented by Formula 2 is any one of the following Formulae 2-1 to 2-14:

Formula 2-1

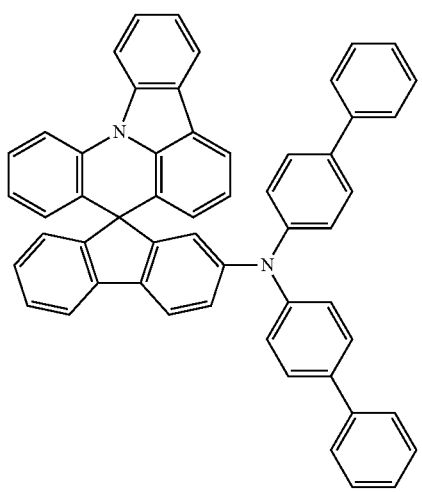

Formula 2-2

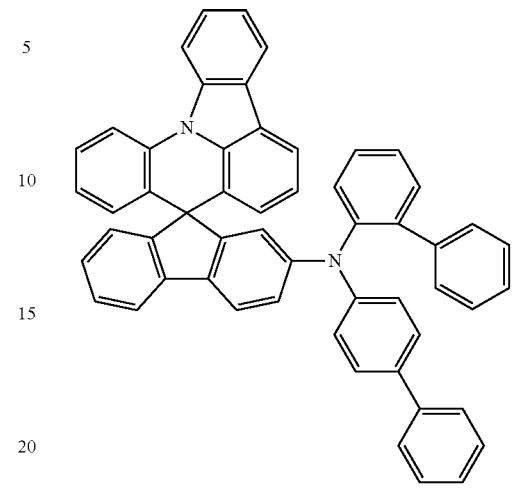

Formula 2-3

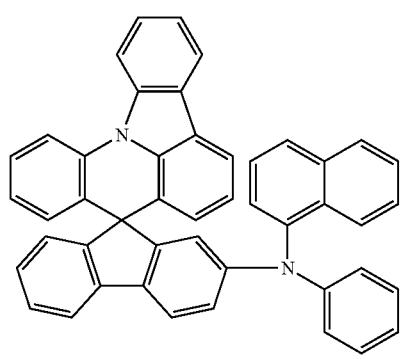

Formula 2-4

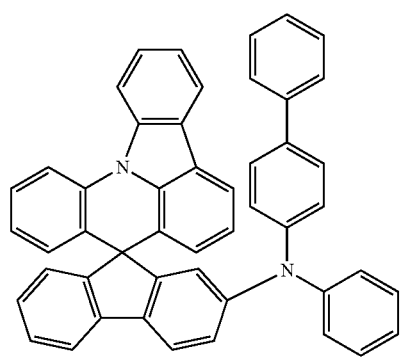

Formula 2-5

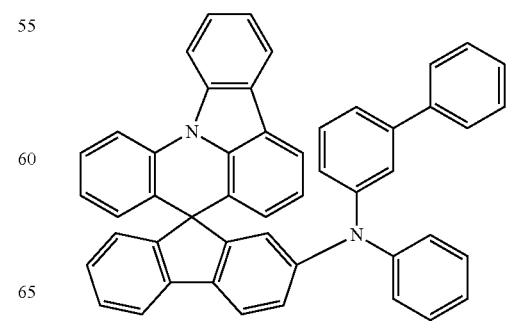

Formula 2-6
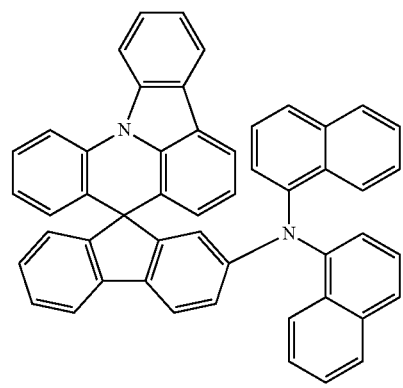
Formula 2-7
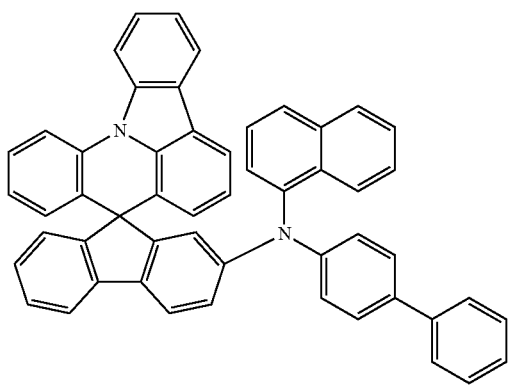
Formula 2-8
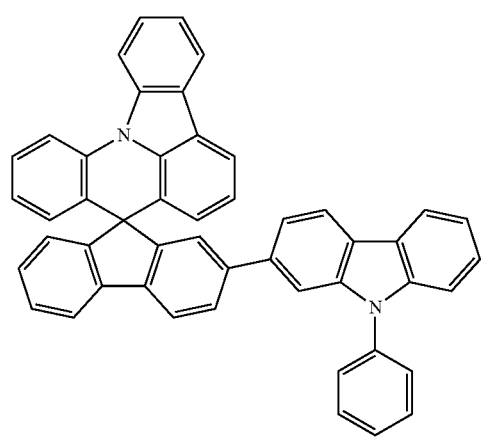
Formula 2-9
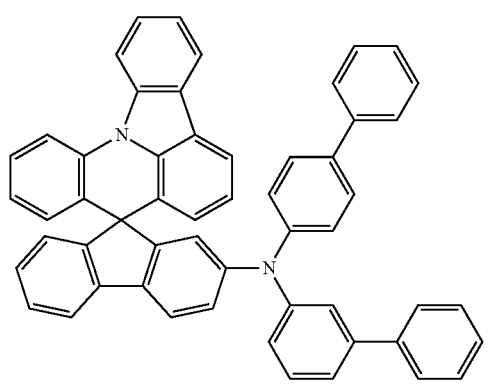
Formula 2-10
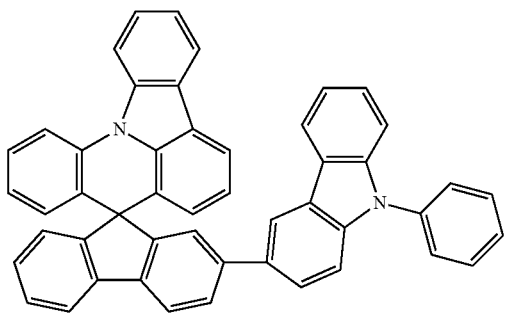
Formula 2-11
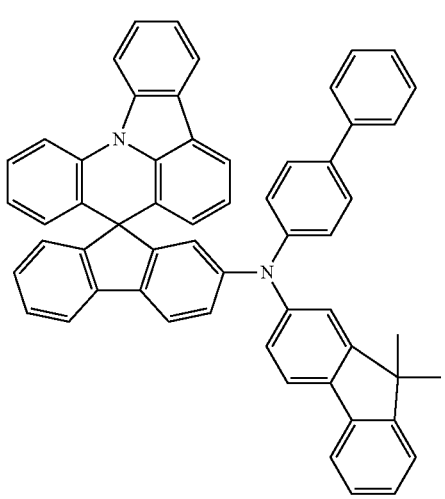
Formula 2-12
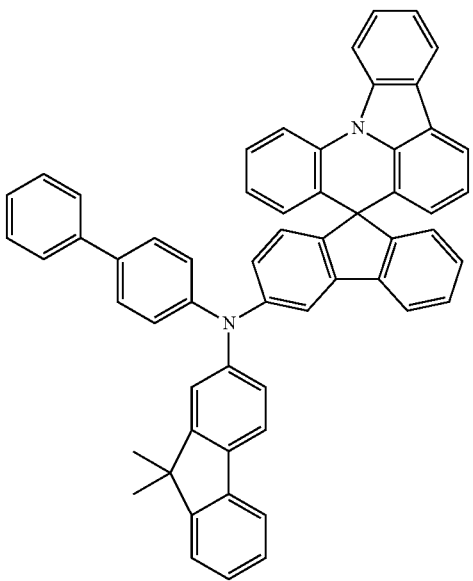

Formula 2-13

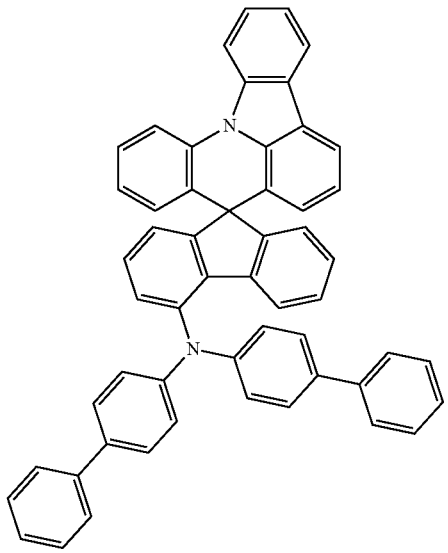

Formula 2-14

11. The organic light emitting diode of claim 1, wherein the organic light emitting diode further comprises one or two or more selected from the group consisting of a hole injection layer, a hole transporting layer, an electron transporting layer, an electron injection layer, an electron adjusting layer, an electron blocking layer, and a hole blocking layer.

* * * * *